(12) United States Patent
Jung et al.

(10) Patent No.: US 10,950,619 B2
(45) Date of Patent: Mar. 16, 2021

(54) SEMICONDUCTOR MEMORY DEVICE

(71) Applicant: SAMSUNG ELECTRONICS CO., LTD., Suwon-si (KR)

(72) Inventors: Young-Jin Jung, Hwaseong-si (KR); Sunghan Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 204 days.

(21) Appl. No.: 16/223,894

(22) Filed: Dec. 18, 2018

(65) Prior Publication Data
US 2019/0326317 A1 Oct. 24, 2019

(30) Foreign Application Priority Data
Apr. 20, 2018 (KR) .................. 10-2018-0046193

(51) Int. Cl.
| | |
|---|---|
| *H01L 27/11582* | (2017.01) |
| *H01L 27/11565* | (2017.01) |
| *H01L 27/11573* | (2017.01) |
| *H01L 29/423* | (2006.01) |
| *H01L 27/1157* | (2017.01) |

(52) U.S. Cl.
CPC .... *H01L 27/11582* (2013.01); *H01L 27/1157* (2013.01); *H01L 27/11565* (2013.01); *H01L 27/11573* (2013.01); *H01L 29/42344* (2013.01)

(58) Field of Classification Search
CPC ......... H01L 27/11582; H01L 27/11575; H01L 27/11573; H01L 27/11565; H01L 27/11578
See application file for complete search history.

(56) References Cited

U.S. PATENT DOCUMENTS

| | | | |
|---|---|---|---|
| 9,379,134 B2 * | 6/2016 | Lee ..................... | H01L 27/1157 |
| 9,431,418 B2 | 8/2016 | Nam et al. | |
| 9,536,897 B2 * | 1/2017 | Yoo ................... | H01L 27/11582 |
| 9,711,531 B2 | 7/2017 | Lee et al. | |
| 9,716,104 B2 * | 7/2017 | Kim ........................ | H01L 28/00 |
| 9,773,806 B1 | 9/2017 | Lee et al. | |
| 9,642,849 B2 | 12/2017 | Yamasaki | |
| 9,859,296 B2 | 1/2018 | Park et al. | |
| 10,109,644 B2 * | 10/2018 | Shin .................. | H01L 27/11565 |
| 10,153,292 B2 * | 12/2018 | Kim .................. | H01L 27/11582 |
| 10,553,606 B2 * | 2/2020 | Kim .................. | H01L 27/11565 |
| 10,777,565 B2 * | 9/2020 | Jung .................. | H01L 27/11575 |
| 10,818,687 B2 * | 10/2020 | Kim .................. | H01L 27/11556 |

(Continued)

FOREIGN PATENT DOCUMENTS

KR     1020150048553     5/2015

*Primary Examiner* — Sophia T Nguyen
(74) *Attorney, Agent, or Firm* — F. Chau & Associates, LLC

(57) ABSTRACT

A semiconductor memory device includes a substrate including a cell array region and a pad region, a stack structure disposed on the cell array region and the pad region of the substrate and including gate electrodes, a device isolation layer vertically overlapping the stack structure and disposed in the pad region of the substrate, a dummy vertical channel portion penetrating the stack structure on the pad region of the substrate and disposed in the device isolation layer, and a dummy semiconductor pillar disposed between the dummy vertical channel portion and one portion of the substrate being in contact with one sidewall of the device isolation layer.

25 Claims, 27 Drawing Sheets

(56) References Cited

U.S. PATENT DOCUMENTS

| | | | | |
|---|---|---|---|---|
| 2015/0145015 | A1* | 5/2015 | Shin | H01L 27/11531 257/314 |
| 2015/0348987 | A1* | 12/2015 | Lee | H01L 27/11582 257/326 |
| 2016/0005759 | A1* | 1/2016 | Kim | H01L 27/11524 257/314 |
| 2016/0049423 | A1* | 2/2016 | Yoo | H01L 27/1157 257/324 |
| 2016/0056169 | A1* | 2/2016 | Lee | H01L 27/11578 438/269 |
| 2016/0118399 | A1* | 4/2016 | Son | H01L 27/11526 365/185.18 |
| 2016/0148947 | A1* | 5/2016 | Seo | H01L 27/11565 257/324 |
| 2016/0225785 | A1* | 8/2016 | Kim | H01L 27/11575 |
| 2016/0293625 | A1* | 10/2016 | Kang | H01L 27/11573 |
| 2016/0293626 | A1* | 10/2016 | Kim | H01L 27/11565 |
| 2016/0351582 | A1* | 12/2016 | Kim | H01L 27/11582 |
| 2017/0040337 | A1* | 2/2017 | Kim | H01L 27/11582 |
| 2017/0133398 | A1* | 5/2017 | Son | G11C 16/26 |
| 2017/0186767 | A1* | 6/2017 | Baek | H01L 27/11575 |
| 2017/0200676 | A1* | 7/2017 | Jeong | H01L 21/76816 |
| 2017/0207221 | A1* | 7/2017 | Kim | H01L 27/11573 |
| 2017/0221813 | A1* | 8/2017 | Kim | H01L 27/115 |
| 2017/0256558 | A1* | 9/2017 | Zhang | H01L 27/1207 |
| 2017/0323900 | A1* | 11/2017 | Kanamori | H01L 27/0688 |
| 2018/0053768 | A1* | 2/2018 | Kim | H01L 27/11575 |
| 2018/0068707 | A1* | 3/2018 | Shin | H01L 21/8239 |
| 2018/0138195 | A1* | 5/2018 | Lee | H01L 29/42348 |
| 2018/0151587 | A1* | 5/2018 | Son | H01L 27/2454 |
| 2018/0166454 | A1* | 6/2018 | Pyon | A61K 47/44 |
| 2018/0294225 | A1* | 10/2018 | Lee | H01L 27/11565 |
| 2018/0308559 | A1* | 10/2018 | Kim | G11C 19/28 |
| 2018/0315770 | A1* | 11/2018 | Choi | H01L 27/11575 |
| 2018/0350831 | A1* | 12/2018 | Kim | G11C 7/14 |
| 2019/0157283 | A1* | 5/2019 | Jung | H01L 27/11573 |
| 2019/0181226 | A1* | 6/2019 | Choi | H01L 29/1037 |
| 2019/0319042 | A1* | 10/2019 | Baek | H01L 27/11578 |
| 2019/0326317 | A1* | 10/2019 | Jung | H01L 27/1157 |
| 2019/0333923 | A1* | 10/2019 | Kim | H01L 27/11573 |
| 2019/0333932 | A1* | 10/2019 | Kim | H01L 27/11565 |
| 2019/0371808 | A1* | 12/2019 | Choi | H01L 27/11565 |

* cited by examiner

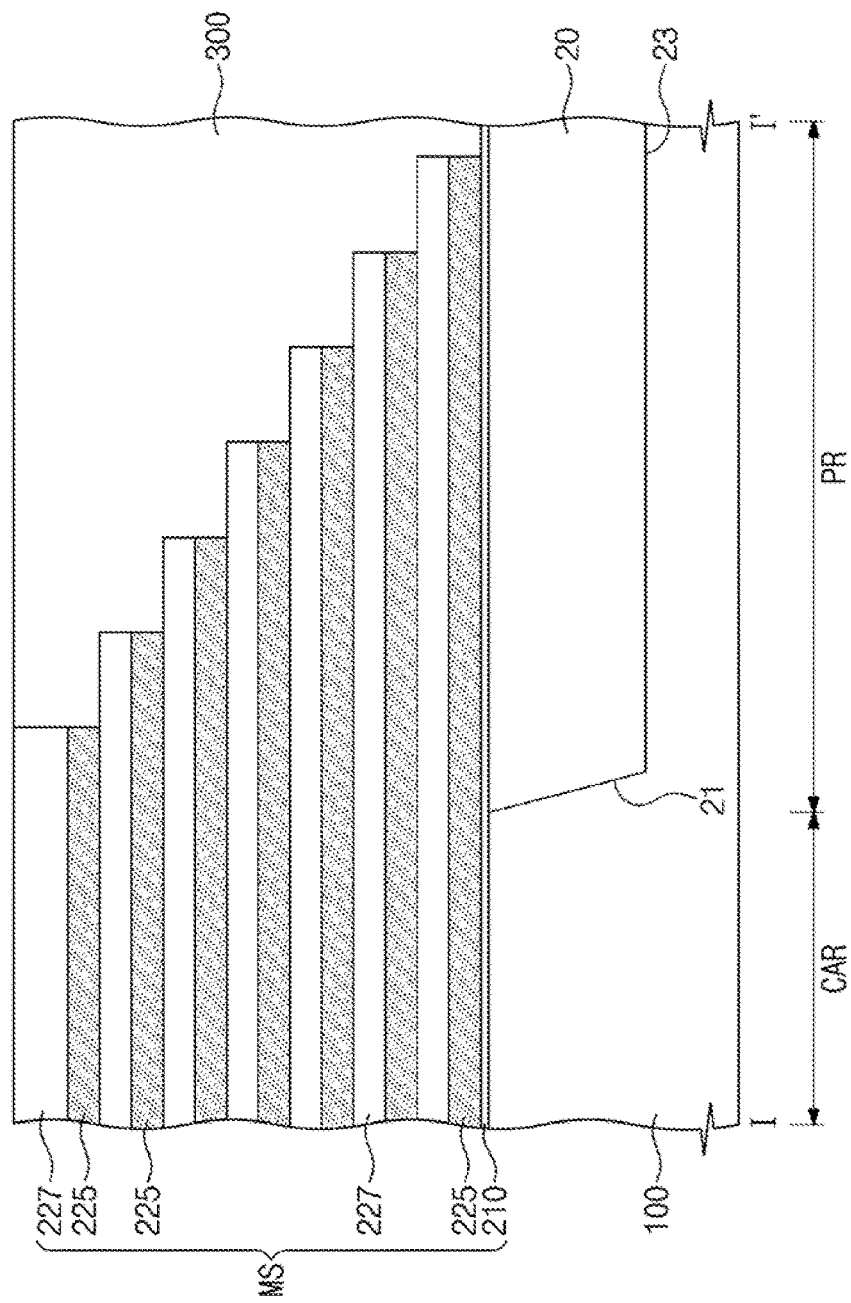

US 10,950,619 B2

SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2018-0046193, filed on Apr. 20, 2018, in the Korean Intellectual Property Office, the disclosure of which is incorporated by reference herein in its entirety.

TECHNICAL FIELD

Exemplary embodiments of the present inventive concept relates to a semiconductor memory device, and more particularly, to a semiconductor memory device with enhanced reliability.

DISCUSSION OF RELATED ART

Recently, semiconductor devices have been highly integrated to provide excellent performance and low manufacture costs. The integration of two-dimensional (2D) or planar semiconductor devices is mainly determined by an area where a unit memory cell occupies, and therefore, may be greatly affected by a technique of forming fine patterns. However, since extremely high-priced apparatuses are needed to form the fine patterns, increasing the integration of the 2D semiconductor devices may be limited. Thus, three-dimensional (3D) semiconductor memory devices, which include memory cells three-dimensionally arranged, have been developed to overcome the above limitations.

SUMMARY

Exemplary embodiments of the present inventive concept may provide a semiconductor memory device with enhanced reliability.

According to an aspect of the present inventive concept, a semiconductor memory device may include a substrate including a cell array region and a pad region, a stack structure disposed on the cell array region and the pad region of the substrate and including gate electrodes, a device isolation layer vertically overlapping the stack structure and disposed in the pad region of the substrate, a first dummy vertical channel portion penetrating the stack structure on the pad region of the substrate and disposed in the device isolation layer, and a first dummy semiconductor pillar disposed between the first dummy vertical channel portion and one portion of the substrate being in contact with one sidewall of the device isolation layer.

According to an aspect of the present inventive concept, a semiconductor memory device may include a substrate including a cell array region and a pad region, a stack structure disposed on the cell array region and the pad region of the substrate and including gate electrodes, a device isolation layer vertically overlapping the stack structure and disposed in the pad region of the substrate, a dummy vertical channel portion penetrating the stack structure on the pad region of the substrate and disposed in the device isolation layer, and a dummy semiconductor pillar disposed between the dummy vertical channel portion and the substrate in the device isolation layer. The dummy vertical channel portion and the dummy semiconductor pillar may be spaced apart from each other.

According to an aspect of the present inventive concept, a semiconductor memory device may include a substrate including a cell array region and a pad region, a stack structure disposed on the cell array region and the pad region of the substrate and including gate electrodes, a device isolation layer vertically overlapping the stack structure and disposed in the pad region of the substrate, a dummy vertical channel portion penetrating the stack structure on the pad region of the substrate and disposed in the device isolation layer, and a dummy semiconductor pillar disposed between the dummy vertical channel portion and the substrate in the device isolation layer. A bottom surface of the dummy semiconductor pillar may be disposed at a level substantially the same as or higher than that of a bottom surface of the device isolation layer.

BRIEF DESCRIPTION OF THE DRAWINGS

The present inventive concept will become more apparent in view of the following detailed description and the accompanying drawings, in which:

FIGS. 18A to 22A are cross-sectional views taken along line I-I' of FIG. 2 to illustrate a method of manufacturing a semiconductor memory device according to an exemplary embodiment of the present inventive concept; and FIGS. 18B to 22B are cross-sectional views taken along line II-II' of FIG. 2 to illustrate a method of manufacturing a semiconductor memory device according to an exemplary embodiment of the present inventive concept.

Figure 1:
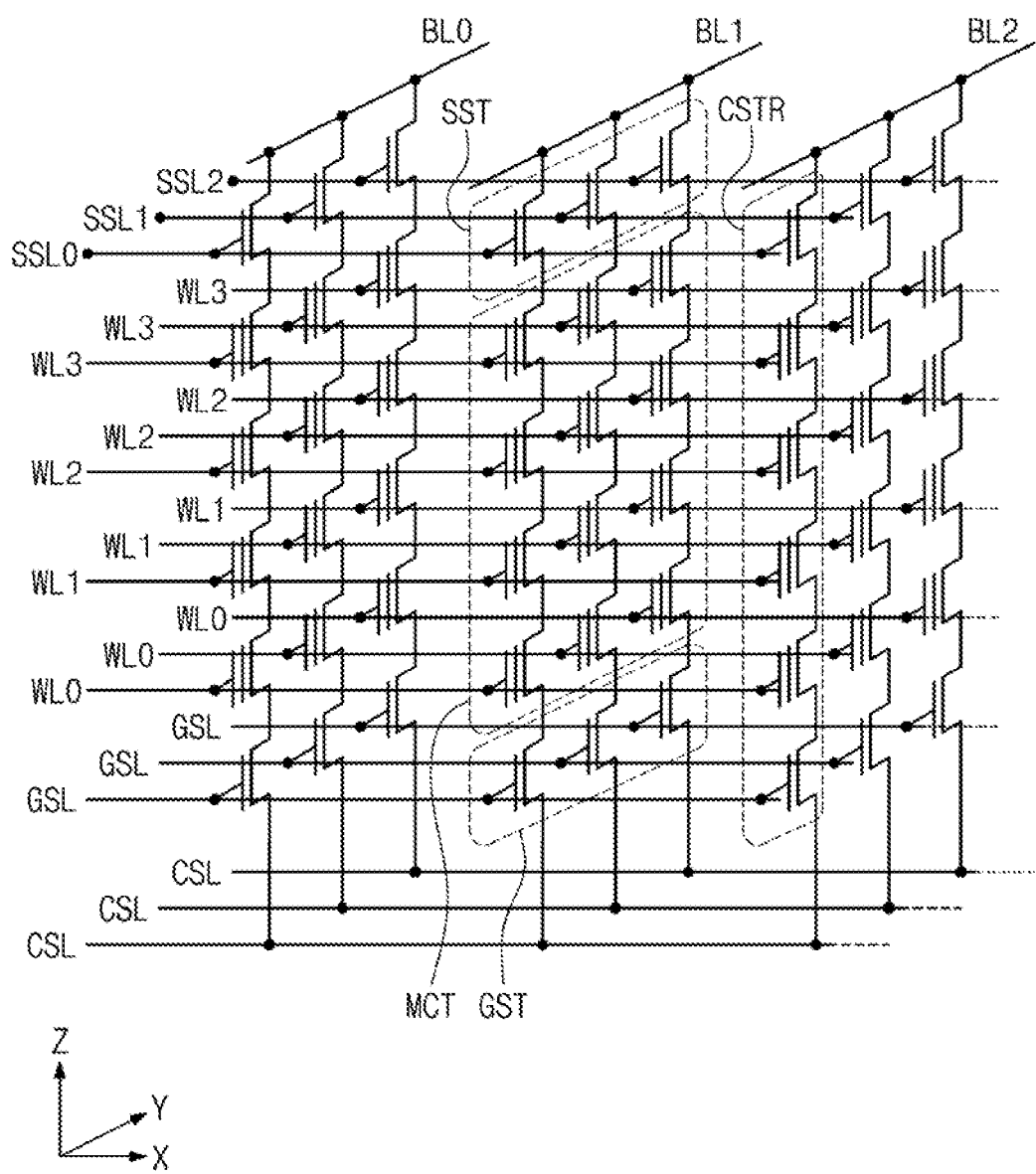
FIG. 1 is a schematic circuit diagram illustrating a cell array of a semiconductor memory device according to an exemplary embodiment of the present inventive concept.

Since the drawings in FIGS. 1-22B are intended for illustrative purposes, the elements in the drawings are not necessarily drawn to scale. For example, some of the elements may be enlarged or exaggerated for clarity purpose.

DETAILED DESCRIPTION OF THE EMBODIMENTS

FIG. 1 is a schematic circuit diagram illustrating a cell array of a semiconductor memory device according to an exemplary embodiment of the present inventive concept.

Referring to FIG. 1, a semiconductor memory device may include a common source line CSL, a plurality of bit lines BL0 to BL2, and a plurality of cell strings CSTR provided between the common source line CSL and the plurality of bit lines BL0 to BL2.

The plurality of bit lines BL0 to BL2 may be two-dimensionally arranged and the plurality of cell strings CSTR may be connected in parallel to each of the plurality of bit lines BL0 to BL2 and connected to the common source line CSL. Thus, the cell strings CSTR may be two-dimensionally arranged on the common source line CSL or a substrate. The common source line CSL may be provided in plural, with the plurality of common source lines CSL supplied with the same voltage, or in some instances independently controlled and supplied with voltages different from each other.

Each of the plurality of cell strings CSTR may include a ground selection transistor GST connected to the common source line CSL, a string selection transistor SST connected to one of the bit lines BL0 to BL2, and a plurality of memory cell transistors MCT provided between the ground selection transistor GST and the string selection transistor SST. The ground selection transistor GST, the memory cell transistors MCT and the string selection transistor SST may be connected in series to each other. A ground selection line GSL, a plurality of word lines WL0 to WL3 and a string selection line SSL0, SSL1 or SSL2, which are disposed between the common source line CSL and the bit lines BL0 to BL2, may be used as gate electrodes of the ground selection transistor GST, the memory cell transistors MCT and the string selection transistor SST, respectively. The sources of a plurality of ground selection transistors GST may be connected in common to the common source line CSL.

Since one cell string CSTR includes the plurality of memory cell transistors MCT respectively located at different levels from the common source line CSL, the word lines WL0 to WL3, which may serve as gate electrodes for the memory cell transistors MCT, respectively located at different levels from each other may be disposed between the common source line CSL and the bit lines BL0 to BL2. The ground and string selection transistors GST and SST and the memory cell transistors MCT may be metal-oxide-semiconductor (MOS) field effect transistors (FETs) using a vertical channel structure as channel regions.

Figure 2:
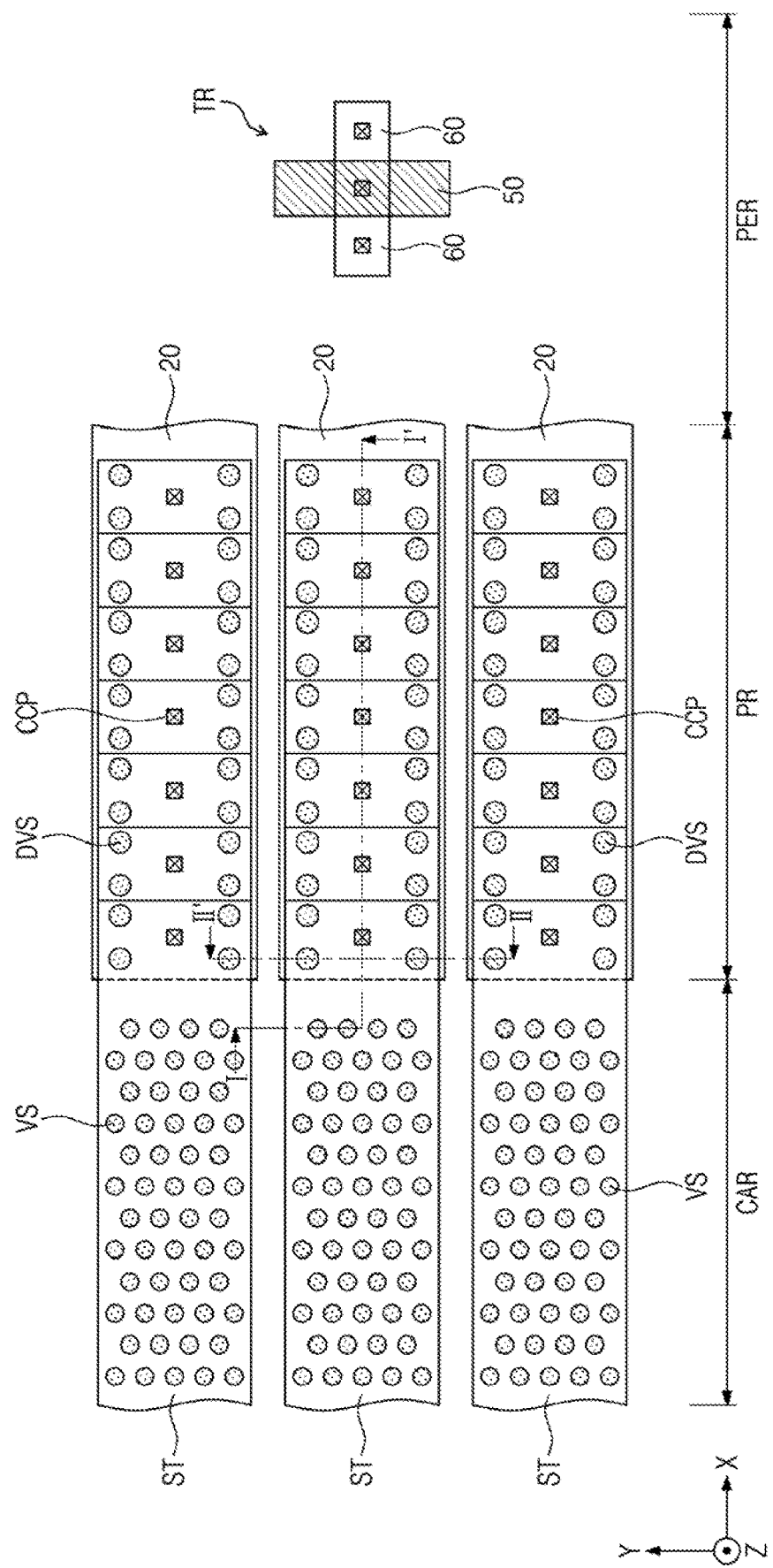
FIG. 2 is a plan view illustrating a semiconductor memory device according to an exemplary embodiment of the present inventive concept.
Figure 3:
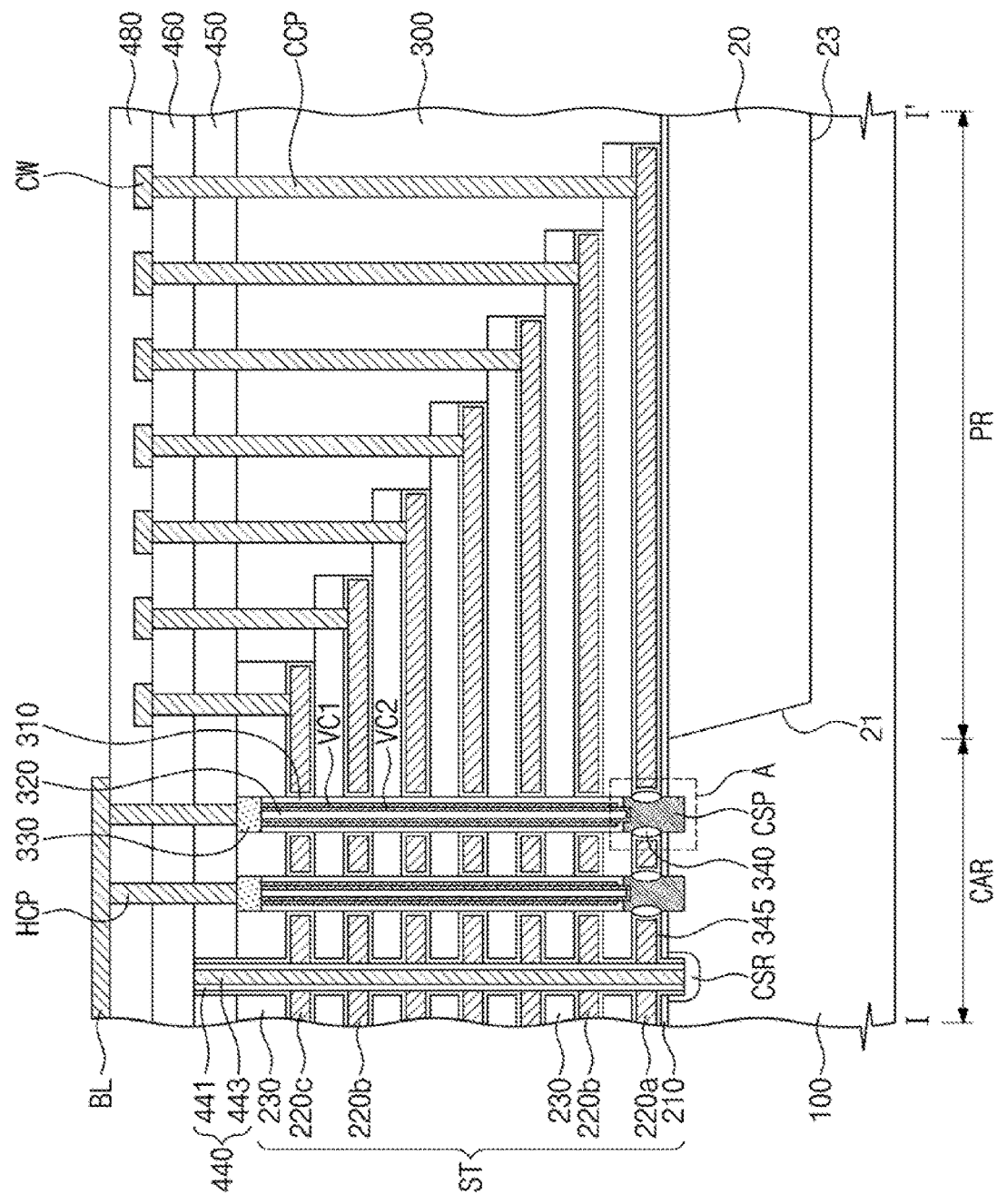
FIG. 3 is a cross-sectional view taken along line I-I' of FIG. 2 to illustrate a semiconductor memory device according to an exemplary embodiment of the present inventive concept.
Figure 4:
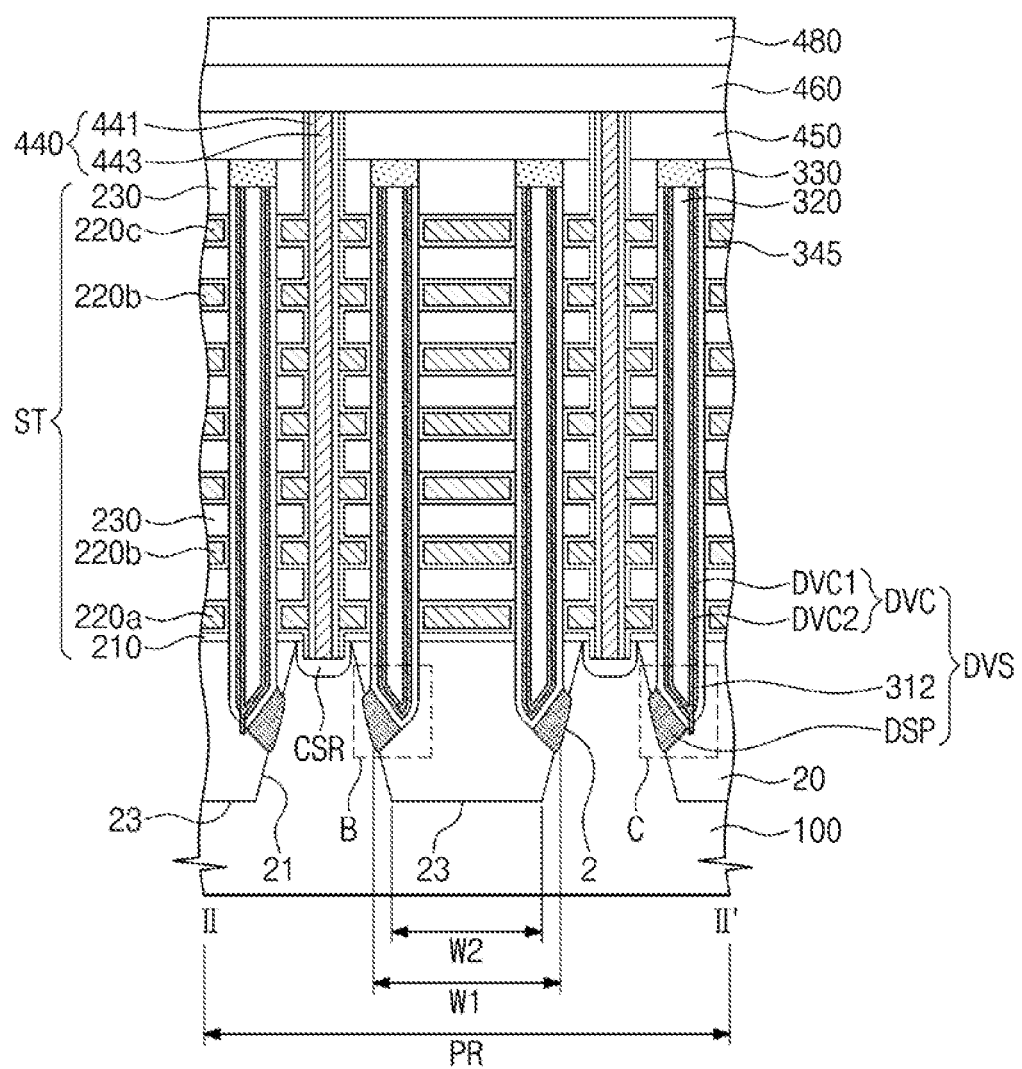
FIG. 4 is a cross-sectional view taken along line II-II' of FIG. 2 to illustrate a semiconductor memory device according to an exemplary embodiment of the present inventive concept.
Figure 5:
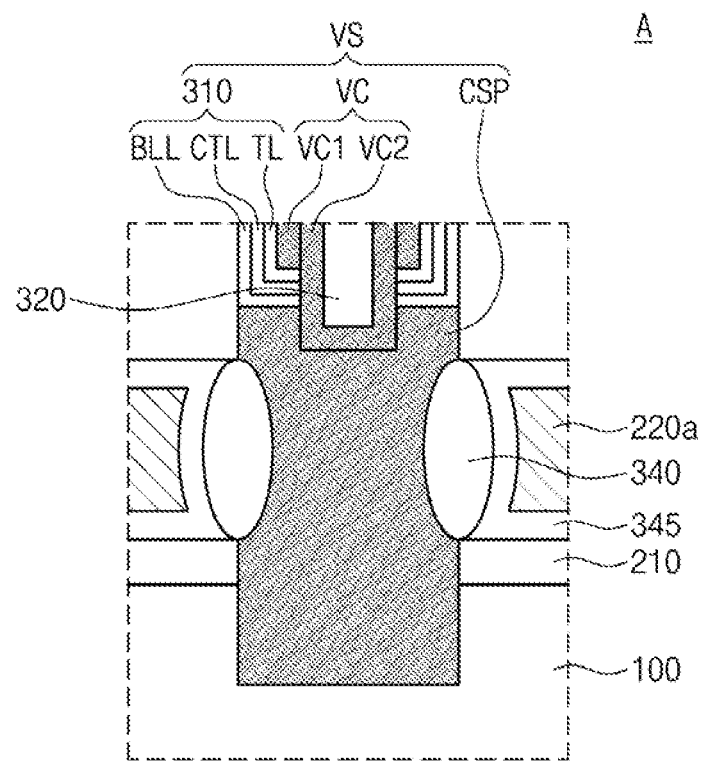
FIG. 5 is an enlarged view of portion 'A' of FIG. 3.
Figure 6:
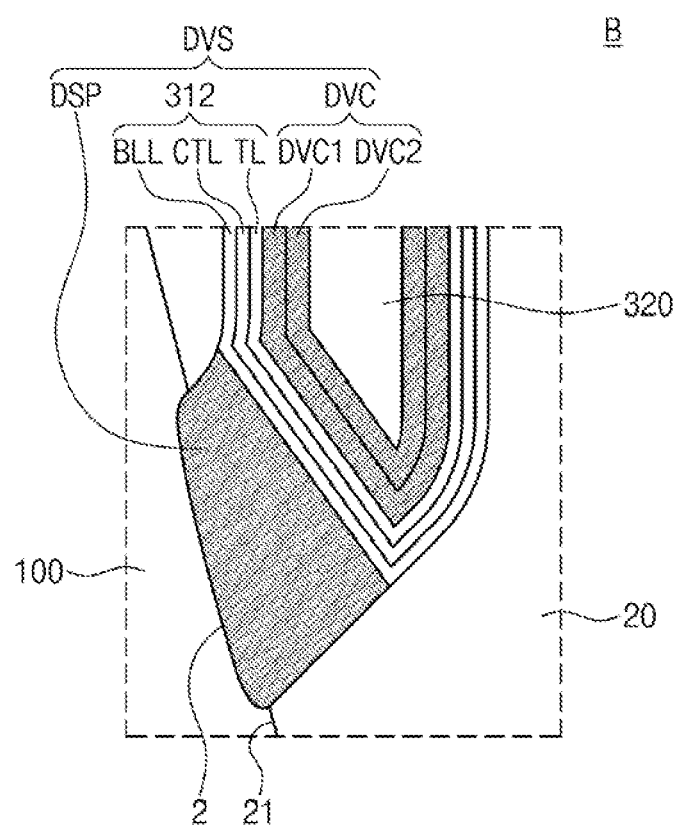
FIG. 6 is an enlarged view of portion 'B' of FIG. 4.
Figure 7:
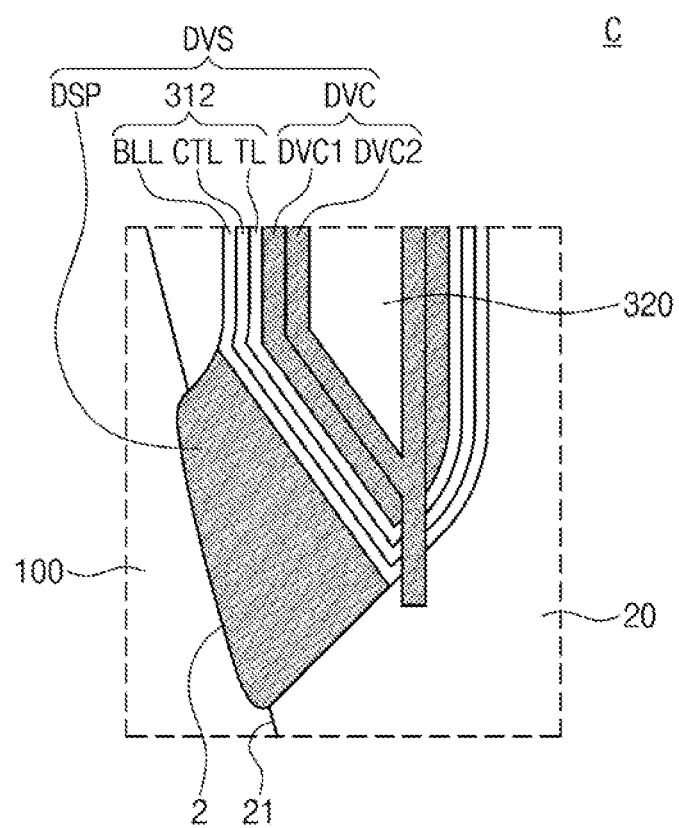
FIG. 7 is an enlarged view of portion 'C' of FIG. 4.

FIG. 2 is a plan view illustrating a semiconductor memory device according to an exemplary embodiment of the present inventive concept. FIG. 3 is a cross-sectional view taken along line I-I' of FIG. 2 to illustrate a semiconductor memory device according to an exemplary embodiment of the present inventive concept. FIG. 4 is a cross-sectional view taken along line IMF of FIG. 2 to illustrate a semiconductor memory device according to an exemplary embodiment of the present inventive concept. FIG. 5 is an enlarged view of portion 'A' of FIG. 3. FIG. 6 is an enlarged view of portion 'B' of FIG. 4. FIG. 7 is an enlarged view of portion 'C' of FIG. 4.

Referring to FIGS. 2 to 7, a peripheral circuit transistor TR and stack structures ST may be disposed on a substrate 100. The substrate 100 may include a cell array region CAR, a pad region PR, and a peripheral circuit region PER. The pad region PR may be located between the cell array region CAR and the peripheral circuit region PER. The substrate 100 may include, for example, a silicon (Si) substrate, a silicon-germanium (SiGe) substrate, a germanium (Ge) substrate, a III-V compound semiconductor substrate, a single-crystalline epitaxial layer grown on a single-crystalline silicon (Si) substrate, or a combination thereof. Any suitable III-V compound semiconductor may be used for the substrate 100 and may include, for example, gallium arsenide (GaAs), indium gallium arsenide (InGaAs), aluminum gallium arsenide (AlGaAs), or a combination thereof.

A device isolation layer 20 may be disposed in the substrate 100, and may have a top surface at a level substantially the same as that of the substrate 100. For example, the device isolation layer 20 may be disposed in the pad region PR of the substrate 100. The device isolation layer 20 may vertically overlap each of the stack structures ST disposed on the pad region PR of the substrate 100. In an exemplary embodiment of the present inventive concept, a width of a top surface of the device isolation layer 20 may be greater than a width of a bottom surface 23 of the device isolation layer 20. In other words, the device isolation layer 20 may have a tapered shape having inclined sidewalls 21.

The device isolation layer 20 may extend into the peripheral circuit region PER of the substrate 100, and may define active regions of the substrate 100 in the peripheral circuit region PER of the substrate 100. The device isolation layer 20 may include, for example, a silicon oxide ($SiO_2$) layer.

The peripheral circuit transistor TR may be disposed on the peripheral circuit region PER of the substrate 100, and may be disposed on each of the active regions of the substrate 100 defined by the device isolation layer 20. The peripheral circuit transistor TR may include a peripheral gate insulating layer, a peripheral gate electrode 50 disposed on the peripheral gate insulating layer, and source/drain regions 60 formed in the substrate 100 at both sides of the peripheral gate electrode 50. Spacers may be formed to cover opposite sidewalls of the peripheral gate electrode 50.

The stack structures ST may be disposed on the cell array region CAR and the pad region PR of the substrate 100. The stack structures ST may extend in a first direction X parallel to the extending direction of the device isolation layer 20 on a top surface of the substrate 100, and may be spaced apart from each other in a second direction Y intersecting the first direction X. The first and second directions X and Y may be parallel to a top surface of the substrate 100. A common source region CSR may be disposed in the substrate 100 between the stack structures ST, and may extend in the first direction X parallel to the extending direction of the stack structures ST. When viewed in plan, each of the stack structures ST may be disposed between the common source regions CSR adjacent to each other. The common source region CSR may be formed by doping the substrate 100 with an impurity having a conductivity type different from that of the substrate 100.

Each of the stack structures ST may include a buffer oxide layer 210, gate electrodes 220a, 220b and 220c, and insulating patterns 230. The gate electrodes 220a, 220b and 220c and the insulating patterns 230 may be alternately and repeatedly stacked on the buffer oxide layer 210. The buffer oxide layer 210 may extend onto the peripheral circuit region PER of the substrate 100 and may cover the top surface of the substrate 100. For example, the buffer oxide layer 210 may include a thermal oxide layer or a silicon oxide ($SiO_2$) layer. For example, the buffer oxide layer 210 may be formed through thermal oxidation of the silicon substrate 100 to form the silicon oxide ($SiO_2$) layer or through deposition of the silicon oxide ($SiO_2$) layer to cover the substrate 100. The gate electrodes 220a, 220b and 220c may include a ground selection gate electrode 220a, cell gate electrodes 220b, and a string selection gate electrode 220c. The ground selection gate electrode 220a may correspond to a lowermost one of the gate electrodes 220a, 220b and 220c, and the string selection gate electrode 220c may correspond to an uppermost one of the gate electrodes 220a, 220b and 220c. The cell gate electrodes 220b may be disposed between the ground selection gate electrode 220a and the string selection gate electrode 220c. The gate electrodes 220a, 220b and 220c may include, for example, doped silicon (Si), a metal (e.g., tungsten (W), copper (Cu), aluminum (Al), titanium (Ti) or tantalum (Ta)), a metal nitride (e.g., titanium nitride (TiN) or tantalum nitride (TaN)), a metal silicide (e.g., titanium silicide ($TiSi_2$), tungsten silicide ($WSi_2$), cobalt silicide ($CoSi_2$) or nickel silicide ($NiSi_2$)), or any combination thereof. In an exemplary embodiment of the present inventive concept, a three-dimensional (3D) semiconductor memory device may be a vertical NAND Flash memory device, and the gate electrodes 220a, 220b and 220c of each of the stack structures ST may serve as gate electrodes for the ground selection transistor GST, memory cell transistors MCT, and a string selection transistor SST, in which these transistors constitute a NAND cell string. The memory cell transistors MCT may be disposed between the ground and string selection transistors GST and SST. The ground selection transistor GST, the memory cell transistors MCT and the string selection transistor SST may be connected in series.

Each of the stack structures ST may have a stepwise structure on the pad region PR of the substrate 100 for electrical connections between gate electrodes 220a, 220b and 220c and a peripheral circuit structure PS to be described. For example, a height of each of the stack structures ST on the pad region PR of the substrate 100 may decrease as a horizontal distance from the cell array region CAR increases. In other words, lengths of the gate electrodes 220a, 220b and 220c in the first direction X may decrease sequentially as a vertical distance from the substrate 100 increases. In an exemplary embodiment of the present inventive concept, the gate electrodes 220a, 220b and 220c may have end portions on the pad region PR of the substrate 100. Each of the end portions of the ground selection and cell gate electrodes 220a and 220b may be exposed by a gate electrode disposed directly thereon. Here, "exposed by" means "not vertically covered or overlapped by". For example, each of the ground selection and cell gate electrodes 220a and 220b disposed may be longer than the one directly above, and thus the portion of a gate electrode not vertically overlapped by the one directly above is the end portion of this gate electrode. The end portion of the string selection gate electrode 220c may be a portion of the string selection gate electrode 220c disposed on the pad region PR of the substrate 100.

The insulating patterns 230 may be disposed between the gate electrodes 220a, 220b and 220c stacked in a third direction Z perpendicular to the top surface of the substrate 100. An uppermost one of the insulating patterns 230 may be disposed on the string selection gate electrode 220c. The insulating patterns 230 may include, for example, silicon oxide ($SiO_2$). Lengths of the insulating patterns 230 in the first direction X may decrease sequentially as a vertical distance from the substrate 100 increases. The length, in the first direction X, of each of the insulating patterns 230 may be substantially equal to the length, in the first direction X, of the gate electrode disposed directly under each of the insulating patterns 230. Thicknesses of the insulating patterns 230 may be different depending on characteristics of a semiconductor memory device. For example, the insulating patterns 230 may have one or more thicker than the others, with the others having the same thickness. Here, the thicknesses are measured in the third direction Z. The insulating patterns 230 may cover the end portions of the gate electrodes 220a, 220b and 220c, respectively.

An interlayer insulating pattern 300 may cover the stepwise structures of the stack structures ST and the peripheral circuit transistor TR. For example, interlayer insulating pattern 300 may cover ends of the stack structures ST. A top surface of the interlayer insulating pattern 300 may be disposed at a level substantially the same as that of top surfaces of the stack structures ST. The interlayer insulating pattern 300 may include, for example, a tetraethyl orthosilicate (TEOS) oxide layer.

Cell vertical channel structures VS may penetrate the stack structures ST. For example, the cell vertical channel structures VS may vertically extend (e.g., extend in the third direction Z) on the cell array region CAR of the substrate 100 to penetrate the stack structures ST. Lower portions of the cell vertical channel structures VS may be disposed in the substrate 100. The cell vertical channel structures VS may be arranged in a zigzag form or a line along the first and second directions X and Y when viewed in a plan view. Each of the cell vertical channel structures VS may include a cell semiconductor pillar CSP, a cell vertical channel portion VC disposed on the cell semiconductor pillar CSP, and a cell charge storage structure 310 disposed between the cell vertical channel portion VC and the stack structure ST.

The cell vertical channel portion VC may vertically extend on the top surface of the substrate 100 and may penetrate the stack structure ST. The cell vertical channel portion VC may have a hollow pipe shape, a cylindrical shape, or a cup shape. In an exemplary embodiment of the present inventive concept, a 3D semiconductor memory device may be a vertical NAND Flash memory device, and the cell vertical channel portion VC of each of the cell vertical channel structures VS may serve as channels for the ground selection transistor GST, memory cell transistors MCT, and a string selection transistor SST, in which these transistors constitute a NAND cell string. The cell vertical channel portion VC may include a first vertical channel portion VC1 and a second vertical channel portion VC2. The first vertical channel portion VC1 may surround an outer sidewall of the second vertical channel portion VC2. The second vertical channel portion VC2 may be in contact with a top portion of the cell semiconductor pillar CSP. A bottom end portion of the second vertical channel portion VC2 may be disposed in a recessed region formed in the top portion of the cell semiconductor pillar CSP, and may be in contact with the cell semiconductor pillar CSP. The first vertical channel portion VC1 may be spaced apart from the cell semiconductor pillar CSP.

The cell semiconductor pillar CSP may be disposed between the top surface of the substrate 100 and the cell vertical channel portion VC, and may penetrate the buffer oxide layer 210 and the ground selection gate electrode 220a. A lower portion of the cell semiconductor pillar CSP may be disposed in the substrate 100. For example, the cell semiconductor pillar CSP may have a bottom surface lower than the top surface of the substrate 100, and a top surface higher than a top surface of a lowermost gate electrode of the gate electrodes 220a, 220b and 220c. The cell semiconductor pillar CSP may be in contact with the cell vertical channel portion VC (e.g., the second vertical channel portion VC2). In other words, the cell vertical channel structures VS may be electrically connected to the substrate 100.

The cell charge storage structure 310 may be disposed on the cell semiconductor pillar CSP and between the cell vertical channel portion VC and the cell and string selection gate electrodes 220b and 220c. The cell charge storage structure 310 may extend along an outer sidewall of the cell vertical channel portion VC. For example, the cell charge storage structure 310 may surround an outer sidewall and a bottom surface of the first vertical channel portion VC1 and a portion of the outer sidewall of the second vertical channel portion VC2.

Dummy vertical channel structures DVS may penetrate the stack structures ST and the device isolation layer 20. For example, the dummy vertical channel structures DVS may penetrate the stepwise structures of the stack structures ST and the device isolation layer 20 on the pad region PR of the substrate 100. The stepwise structure of the stack structure ST may include the end portions of the gate electrodes 220a, 220b and 220c. The dummy vertical channel structures DVS may be arranged in a zigzag form or a line when viewed in a plan view.

The dummy vertical channel structures DVS may extend in the third direction Z from a portion of the substrate 100 being in contact with the sidewalls 21 of the device isolation layer 20 to penetrate the device isolation layer 20 and the stack structure ST. In an exemplary embodiment of the present inventive concept, each of lower portions of the dummy vertical channel structures DVS may be bent to the sidewall 21 of the device isolation layer 20 adjacent thereto. For example, the lower portion of one of a pair of the dummy vertical channel structures DVS adjacent to each other in the second direction Y may be disposed on one sidewall 21 of the device isolation layer 20. The lower portion of the other of the pair of dummy vertical channel structures DVS may be disposed on another sidewall 21, opposite to the one sidewall 21, of the device isolation layer 20. In an exemplary embodiment of the present inventive concept, a distance W1, in the second direction Y, between bottom ends of the pair of dummy vertical channel structures DVS may be equal to or greater than a width W2, in the second direction Y, of the bottom surface 23 of the device isolation layer 20 (W1≥W2). In an exemplary embodiment of the present inventive concept, vertical lengths of the dummy vertical channel structures DVS may be greater than vertical lengths of the cell vertical channel structures VS. For example, the dummy vertical channel structures DVS may penetrate deeper under the top surface of the substrate 100 than the cell vertical channel structures VS. In an exemplary embodiment of the present inventive concept, widths of the dummy vertical channel structures DVS may be greater than widths of the cell vertical channel structures VS.

Each of the dummy vertical channel structures DVS may include a dummy semiconductor pillar DSP, a dummy vertical channel portion DVC disposed on the dummy semiconductor pillar DSP, and a dummy charge storage structure 312 disposed between the dummy semiconductor pillar DSP and the dummy vertical channel portion DVC.

For example, a vertical length of the dummy vertical channel portion DVC is greater than a vertical length of the cell vertical channel portion VC, and a width of the dummy vertical channel portion DVC is greater than a width of the cell vertical channel portion VC.

The dummy vertical channel portion DVC may penetrate the stack structure ST and may be disposed in the device isolation layer 20. For example, a lower portion of the dummy vertical channel portion DVC may be formed within the device isolation layer 20, and an upper portion of the dummy vertical channel portion DVC may protrude above the device isolation layer 20. In an exemplary embodiment of the present inventive concept, a bottom surface of the dummy vertical channel portion DVC may be inclined with respect to the top surface of the substrate 100. The dummy vertical channel portion DVC may include a first dummy channel portion DVC1 and a second dummy channel portion DVC2. The first dummy channel portion DVC1 may surround an outer sidewall and a bottom surface of the second dummy channel portion DVC2.

The dummy semiconductor pillar DSP may be disposed between the dummy vertical channel portion DVC and a portion of the substrate 100 being in contact with the sidewall 21 of the device isolation layer 20. The dummy semiconductor pillar DSP may penetrate a portion of the sidewall 21 of the device isolation layer 20, and a lower portion of the dummy semiconductor pillar DSP may be disposed in the substrate 100. The dummy semiconductor pillar DSP may be spaced apart from a portion of the substrate 100 being in contact with the bottom surface 23 of the device isolation layer 20. In other words, the dummy semiconductor pillar DSP may not penetrate the bottom surface 23 of the device isolation layer 20. In an exemplary embodiment of the present inventive concept, a bottom surface 2 of the dummy semiconductor pillar DSP, which is in contact with the substrate 100, may be disposed above the bottom surface 23 of the device isolation layer 20. In an exemplary embodiment of the present inventive concept, the bottom surface 2 of the dummy semiconductor pillar DSP may be inclined with respect to the top surface of the substrate 100. In an exemplary embodiment of the present inventive concept, a top surface of the dummy semiconductor pillar DSP may be lower than a bottom surface of the lowermost gate electrode of the gate electrodes 220a, 220b and 220c. For example, the top surface of the dummy semiconductor pillar DSP may be lower than the top surface of the substrate 100. The dummy semiconductor pillar DSP may correspond to a lower portion of each of the dummy vertical channel structures DVS. For example, the distance W1 between the bottom ends of the pair of dummy vertical channel structures DVS adjacent to each other in the second direction Y may correspond to a distance between bottom ends of a pair of the dummy semiconductor pillars DSP adjacent to each other in the second direction Y.

The dummy charge storage structure 312 may be disposed between the dummy vertical channel portion DVC and the dummy semiconductor pillar DSP. The dummy charge storage structure 312 may extend to surround an outer sidewall of the dummy vertical channel portion DVC, and may combine a horizontal insulating layer 345 to be described to electrically separate or insulate the dummy vertical channel portion DVC from the gate electrodes 220a, 220b and 220c.

In an exemplary embodiment of the present inventive concept, as illustrated in FIG. 6, the dummy charge storage structure 312 may completely surround outer surfaces of the dummy vertical channel portion DVC. The dummy vertical channel portion DVC may be spaced apart from the device isolation layer 20 and the dummy semiconductor pillar DSP. In other words, the dummy vertical channel structures DVS may not be electrically connected to the substrate 100.

In an exemplary embodiment of the present inventive concept, as illustrated in FIG. 7, the dummy vertical channel portion DVC may penetrate the dummy charge storage structure 312 so as to be in contact with the device isolation layer 20. For example, the second dummy channel portion DVC2 may penetrate the first dummy channel portion DVC1 and the dummy charge storage structure 312 so as to be in contact with the device isolation layer 20. However, in this case, the dummy vertical channel portion DVC may be spaced apart from the dummy semiconductor pillar DSP. In other words, the dummy vertical channel structures DVS may not be electrically connected to the substrate 100.

The dummy vertical channel structures DVS illustrated in FIG. 6 and the dummy vertical channel structures DVS illustrated in FIG. 7 may exist together in the semiconductor memory device. In these configurations, the dummy vertical channel portion DVC may be electrically separated or insulated from the substrate 100. Thus, leakage current through the dummy vertical channel portion DVC may be prevented, even when dielectric breakdown occurs at the dummy charge storage structure 312 during repetitive operation of the semiconductor memory device (e.g., a 3D semiconductor memory device) or when a defect exists in the dummy charge storage structure 312 during fabrication process. In addition, since the dummy vertical channel structures DVS may not be electrically connected to the substrate 100, a voltage applied to the substrate 100 may not affect the cell gate electrodes 220b (see FIGS. 3 and 4), and thus electrical characteristics of the semiconductor memory device may be enhanced.

The cell and dummy vertical channel portions VC and DVC may include at least one of, for example, a single-crystalline silicon (Si) layer, an organic semiconductor layer, and a carbon (C) nano-structure. The cell and dummy semiconductor pillars CSP and DSP may include a semiconductor material having a conductivity type the same as that of the substrate 100 or may include an intrinsic semiconductor material. As illustrated in FIGS, 5, 6 and 7, each of the cell and dummy charge storage structures 310 and 312 may include a tunnel insulating layer TL, a blocking insulating layer BLL, and a charge storage layer CTL. The tunnel insulating layer TL may be adjacent to each of the cell and dummy vertical channel portions VC and DVC and may surround the outer sidewall of each of the cell and dummy vertical channel portions VC and DVC. The blocking insulating layer BLL may be adjacent to the gate electrodes 220a, 220b and 220c. The charge storage layer CTL may be disposed between the tunnel insulating layer TL and the blocking insulating layer BLL. For example, the tunnel insulating layer TL may include a silicon oxide ($SiO_2$) layer and/or a high-k dielectric layer (e.g., aluminum oxide ($Al_2O_3$) or hafnium oxide ($HfO_2$)). For example, the blocking insulating layer BLL may include a silicon oxide ($SiO_2$) layer and/or a high-k dielectric layer (e.g., aluminum oxide ($Al_2O_3$) or hafnium oxide ($HfO_2$)). For example, the charge storage layer CTL may include a silicon nitride ($Si_3N_4$) layer.

A gap-fill layer 320 may be disposed in an inner space surrounded by each of the cell and dummy vertical channel portions VC and DVC. For example, the gap-fill layer 320 may include at least one of, for example, a silicon oxide ($SiO_2$) layer, a silicon nitride ($Si_3N_4$) layer, and a silicon oxynitride (SiON) layer. Alternatively, the inner space surrounded by each of the cell and dummy vertical channel portions VC and DVC may not be filled with the gap-fill layer 320, and each of the cell vertical channel structures VS and dummy vertical channel structures DVS may include a hollow space or an air gap in the inner space defined by each of the cell and dummy vertical channel portions VC and DVC. A pad 330 may be disposed on each of the cell and dummy vertical channel portions VC and DVC. The pad 330 may include a conductive material or a semiconductor material doped with dopants of which a conductivity type is different from that of the cell and dummy vertical channel portions VC and DVC.

As illustrated in FIG. 5, a gate insulating layer 340 may be disposed between the cell semiconductor pillar CSP and the ground selection gate electrode 220a. Sidewalls of the gate insulating layer 340 may have curved surfaces which are convex in opposite directions to each other. For example, the gate insulating layer 340 may include a thermal oxide layer. For example, the gate insulating layer 340 may be formed through thermal oxidation of the semiconductor material such as silicon (Si) of the cell semiconductor pillar CSP to form a silicon oxide ($SiO_2$) layer. A horizontal insulating layer 345 may be disposed between the cell charge storage structure 310 and the cell and string selection gate electrodes 220b and 220c, between the dummy charge storage structure 312 and the gate electrodes 220a, 220b and 220c, and between the gate insulating layer 340 and the ground selection gate electrode 220a. The horizontal insulating layer 345 may extend onto top surfaces and bottom surfaces of the gate electrodes 220a, 220b and 220c. For example, the horizontal insulating layer 345 may include a silicon oxide ($SiO_2$) layer and/or a high-k dielectric layer (e.g., aluminum oxide ($Al_2O_3$) or hafnium oxide ($HfO_2$)).

A first interlayer insulating layer 450 may be disposed on the stack structures ST and the interlayer insulating pattern 300, and may cover the top surface of the interlayer insulating pattern 300 and the top surfaces of the stack structures ST. For example, the first interlayer insulating layer 450 may include a silicon oxide ($SiO_2$) layer.

A contact structure 440 may be disposed between the stack structures ST adjacent to each other in the second direction Y. The contact structure 440 may extend in the first direction X and may be disposed on the cell array region CAR and the pad region PR of the substrate 100. The contact structure 440 may have a rectangular or linear shape extending in the first direction X when viewed from a plan view. In an exemplary embodiment of the present inventive concept, the contact structure 440 may be provided in plural, and the plurality of contact structures 440 may be arranged along the common source region CSR in the first direction X. In this case, the plurality of contact structures 440 may have pillar shapes.

The contact structure 440 may include a spacer 441 and a common source contact 443. The common source contact 443 may be electrically connected to the common source region CSR. For example, the common source contact 443 may include at least one of a metal material (e.g., tungsten (W), copper (Cu), or aluminum (Al)) and a transition metal material (e.g., titanium (Ti) or tantalum (Ta)). The spacer 441 may surround an outer sidewall of the common source contact 443, and may be disposed between the common source contact 443 and the sidewalls of the stack structures ST. For example, the spacer 441 may include an insulating material (e.g., a silicon oxide ($SiO_2$) layer or a silicon nitride ($Si_3N_4$) layer).

A second interlayer insulating layer 460 may be disposed on the first interlayer insulating layer 450. The second interlayer insulating layer 460 may cover a top surface of the first interlayer insulating layer 450. For example, the second interlayer insulating layer 460 may include a silicon oxide (SiO$_2$) layer. Cell contact plugs CCP may be disposed on the pad region PR of the substrate 100. The cell contact plugs CCP may penetrate the first and second interlayer insulating layers 450 and 460, the interlayer insulating pattern 300, and the insulating patterns 230 covering the end portions of the gate electrodes 220a, 220b and 220c so as to be disposed on the end portions of the gate electrodes 220a, 220b and 220c, respectively. The cell contact plugs CCP may be in direct contact with top surfaces of the end portions of the gate electrodes 220a, 220b and 220c. The cell contact plugs CCP may include at least one of a metal material (e.g., copper (Cu) or tungsten (W)) and a metal nitride material (e.g., titanium nitride (TiN), tantalum nitride (TaN), or tungsten nitride (WN)).

Connection lines CW may be disposed on the second interlayer insulating layer 460. The connection lines CW may be disposed on top surfaces of the cell contact plugs CCP, and may include a metal material (e.g., tungsten (W) or aluminum (Al)). A third interlayer insulating layer 480 may be disposed on the second interlayer insulating layer 460, and may cover the connection lines CW. For example, the third interlayer insulating layer 480 may include a silicon oxide (SiO$_2$) layer.

Channel contact plugs HCP may be disposed on the cell vertical channel structures VS, respectively, and may be in direct contact with the pads 330. For example, the channel contact plugs HCP may include at least one of a metal material (e.g., copper (Cu) or tungsten (W)) and a metal nitride material (e.g., titanium nitride (TiN), tantalum nitride (TaN), or tungsten nitride (WN)).

Bit lines BL may be disposed on the third interlayer insulating layer 480. The bit lines BL may extend in the second direction Y to intersect the stack structures ST, and may be spaced apart from each other in the first direction X on the third interlayer insulating layer 480. Each of the bit lines BL may be electrically connected to the cell vertical channel portions VC of the cell vertical channel structures VS arranged in the second direction Y. For example, the bit lines BL may be connected to the pads 330 through the channel contact plugs HCP. For example, the bit lines BL may include a metal material (e.g., tungsten (W) or aluminum (Al)).

Figure 8:
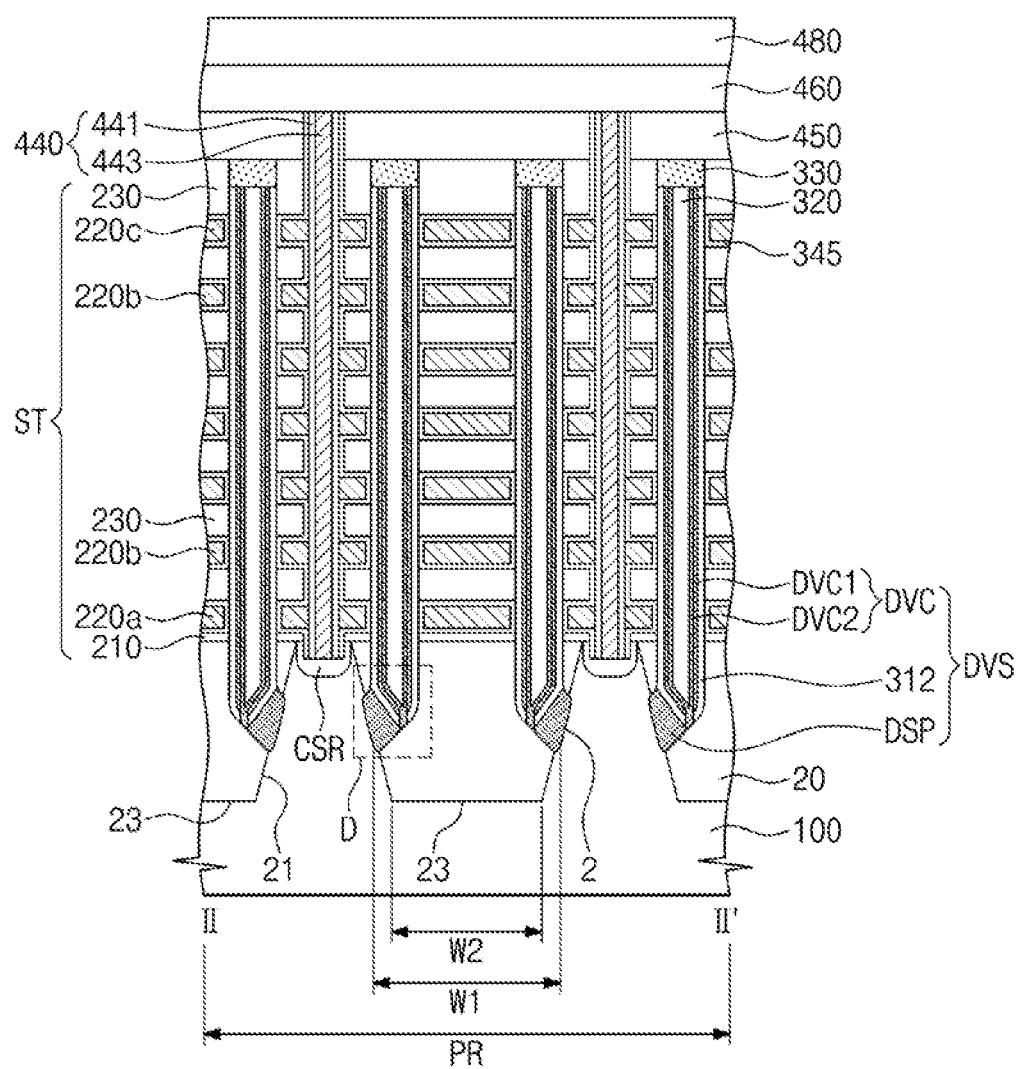
FIG. 8 is a cross-sectional view taken along line II-II' of FIG. 2 to illustrate a semiconductor memory device according to an exemplary embodiment of the present inventive concept.
Figure 9:
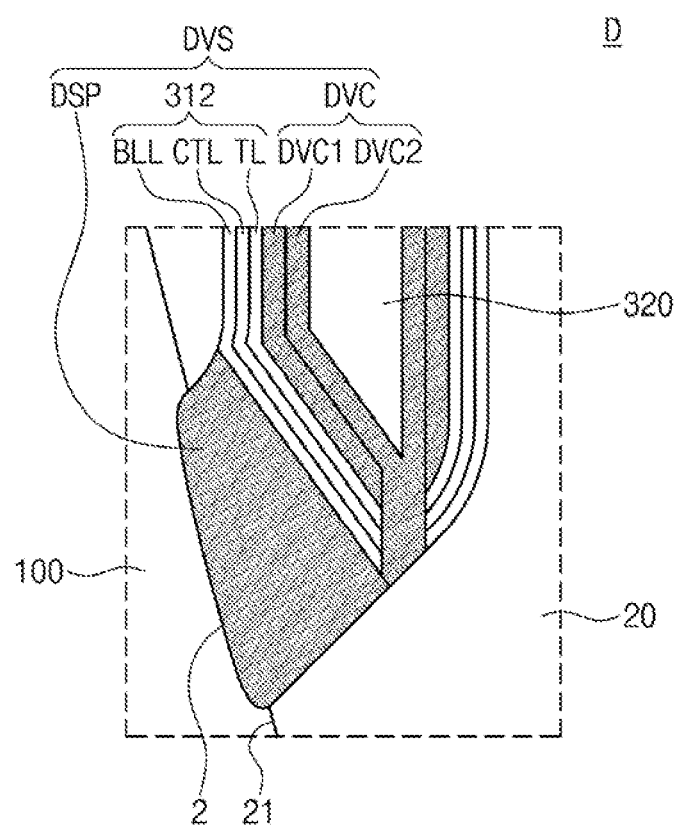
FIG. 9 is an enlarged view of portion 'D' of FIG. 8.

FIG. 8 is a cross-sectional view taken along line II-II' of FIG. 2 to illustrate a semiconductor memory device according to an exemplary embodiment of the present inventive concept. FIG. 9 is an enlarged view of portion 'D' of FIG. 8. Hereinafter, the same elements or components as described in the above exemplary embodiments will be indicated by the same reference numerals or the same reference designators, and the descriptions thereto will be omitted or mentioned briefly for the purpose of ease and convenience in explanation.

Referring to FIGS. 8 and 9, the dummy vertical channel portion DVC may penetrate the dummy charge storage structure 312 so as to be in contact with the device isolation layer 20 and the dummy semiconductor pillar DSP. For example, the second dummy channel portion DVC2 may penetrate the first dummy channel portion DVC1 and the dummy charge storage structure 312 so as to be in contact with the device isolation layer 20 and the dummy semiconductor pillar DSP. Thus, the dummy vertical channel structures DVS may be electrically connected to the substrate 100. The dummy vertical channel structures DVS of FIGS. 8 and 9 may exist together with the dummy vertical channel structures DVS of FIGS. 5 to 7 in a semiconductor memory device. Thus, the dummy semiconductor pillar DSP may be formed on a portion of the substrate 100 being in contact with the sidewall 21 of the device isolation layer 20, and thus a gate insulating layer 340 (see FIGS. 3 and 5) may not be formed on a sidewall of the dummy semiconductor pillar DSP. As a result, a breakdown phenomenon between the ground selection gate electrode 220a (see FIGS. 4 and 8) and the dummy vertical channel structure DVS (see FIGS. 4 and 8) may be prevented.

Figure 10:
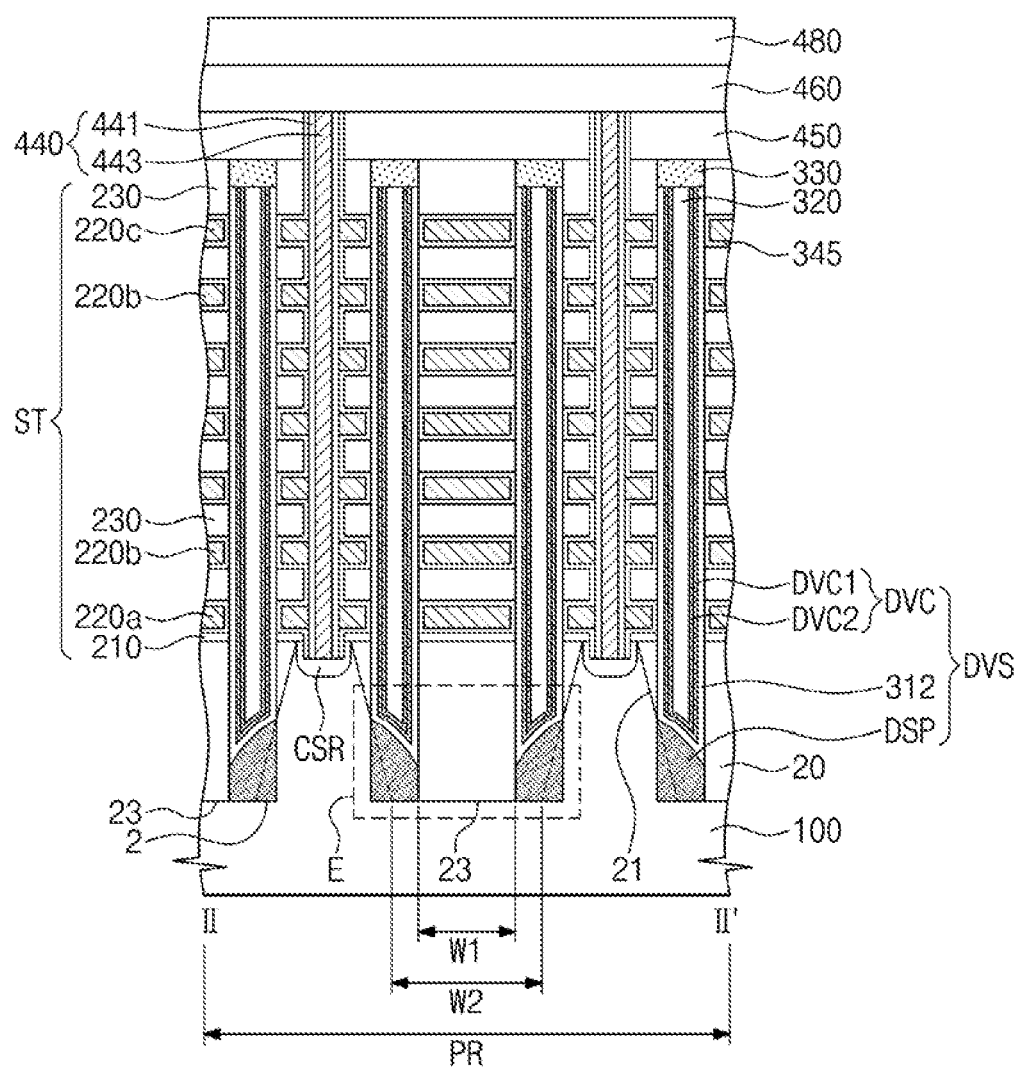
FIG. 10 is a cross-sectional view taken along line II-II' of FIG. 2 to illustrate a semiconductor memory device according to an exemplary embodiment of the present inventive concept.
Figure 11:
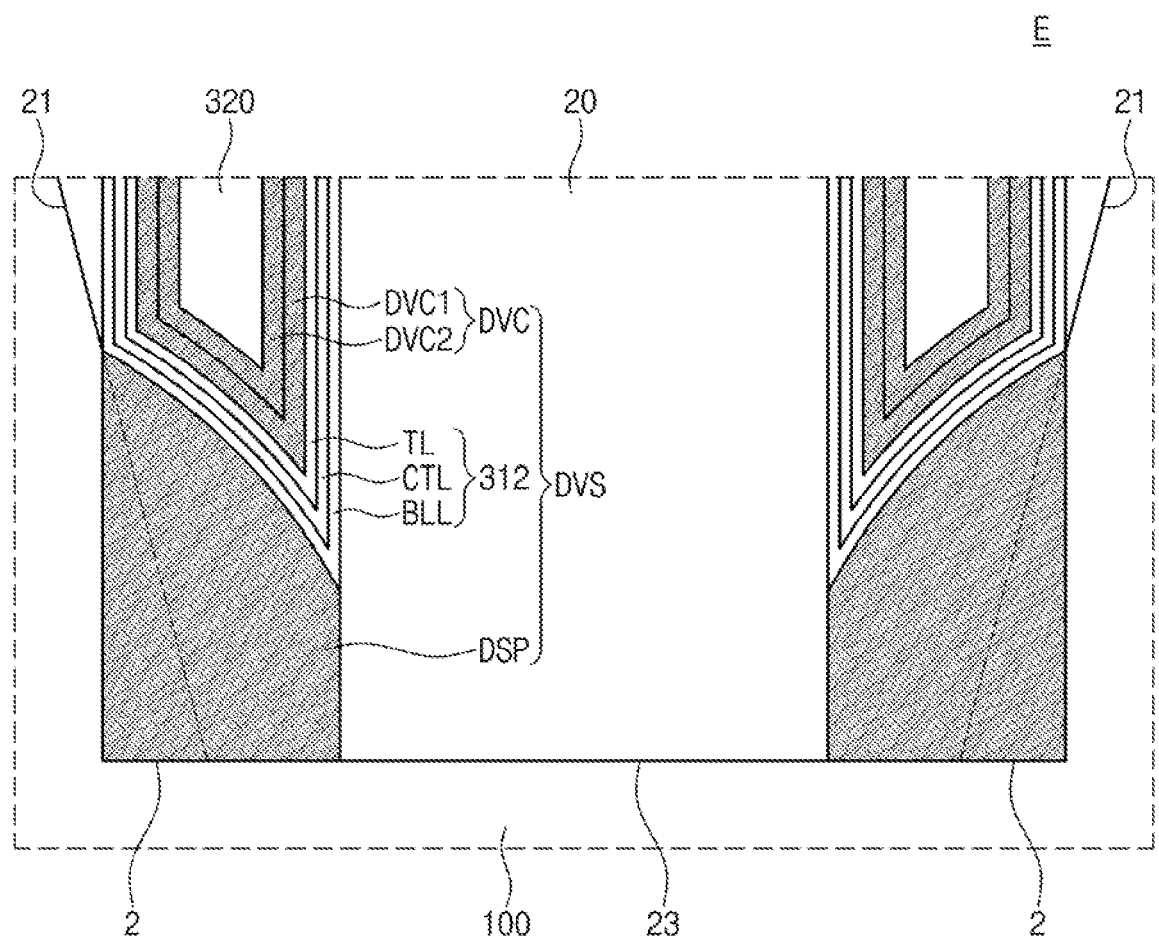
FIG. 11 is an enlarged view of portion 'E' of FIG. 10.
Figure 12:
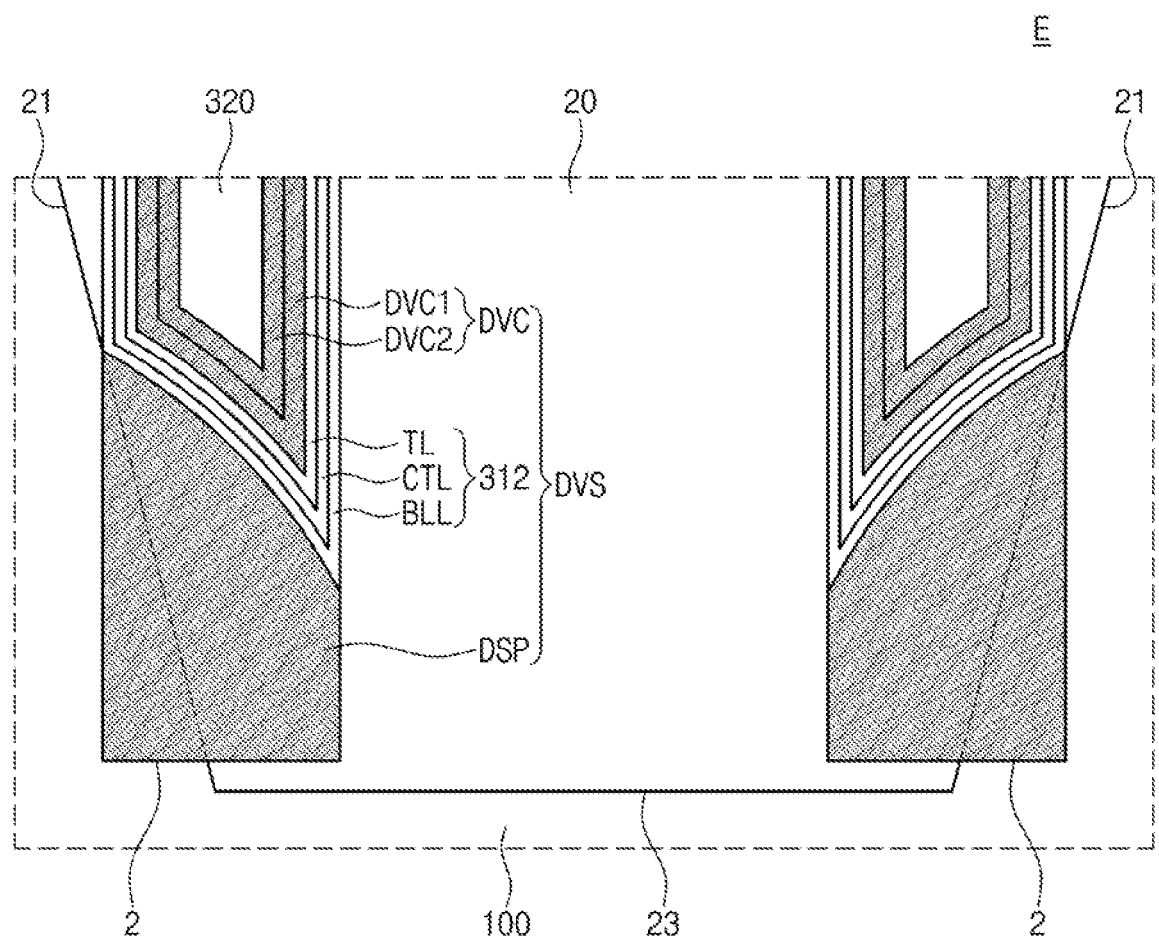
FIG. 12 is an enlarged view of portion 'E' of FIG. 10.

FIG. 10 is a cross-sectional view taken along line II-II' of FIG. 2 to illustrate a semiconductor memory device according to an exemplary embodiment of the present inventive concept. FIGS. 11 and 12 are enlarged views of portion 'E' of FIG. 10. Hereinafter, the same elements or components as described in the above exemplary embodiments will be indicated by the same reference numerals or the same reference designators, and the descriptions thereto will be omitted or mentioned briefly for the purpose of ease and convenience in explanation.

Referring to FIGS. 10, 11 and 12, dummy vertical channel structures DVS may be in contact with a portion of the substrate 100 being in contact with the sidewall 21 of the device isolation layer 20. The dummy vertical channel structures DVS may penetrate the stack structure ST and a portion of the sidewall 21 of the device isolation layer 20. For example, as illustrated in FIG. 11, a dummy semiconductor pillar DSP of each of the dummy vertical channel structures DVS may penetrate a portion of the sidewall 21 of the device isolation layer 20 so as to be in contact with the substrate 100 and may also be in contact with a portion of the substrate 100 being in contact with the bottom surface 23 of the device isolation layer 20. Bottom surfaces of the dummy vertical channel structures DVS may be located at a level substantially the same as that of the bottom surface 23 of the device isolation layer 20. Alternatively, as illustrated in FIG. 12, the dummy semiconductor pillar DSP of each of the dummy vertical channel structures DVS may penetrate a portion of the sidewall 21 of the device isolation layer 20 so as to be in contact with the substrate 100 and may be spaced apart from the portion of the substrate 100 being in contact with the bottom surface 23 of the device isolation layer 20. In this case, the bottom surfaces of the dummy vertical channel structures DVS may be located above the bottom surface 23 of the device isolation layer 20. In other words, the bottom surfaces of the dummy vertical channel structures DVS may be located at a level higher than that of the bottom surface 23 of the device isolation layer 20. Each of the bottom surfaces of the dummy vertical channel structures DVS may be a bottom surface 2 of the dummy semiconductor pillar DSP. The bottom surface 2 of the dummy semiconductor pillar DSP may be parallel to the top surface of the substrate 100. Thus, the bottom surface 2 of the dummy semiconductor pillar DSP may be disposed above the bottom surface 23 of the device isolation layer 20.

In an exemplary embodiment of the present inventive concept, a distance W1 between bottom ends of a pair of the dummy vertical channel structures DVS adjacent to each other in the second direction Y may be smaller than the width W2 of the bottom surface 23 of the device isolation layer 20 (W1<W2), as illustrated in FIG. 10. Alternatively, the distance W1 between the bottom ends of the pair of dummy vertical channel structures DVS adjacent to each other in the second direction Y may be equal to or greater than the width W2 of the bottom surface 23 of the device isolation layer 20 (W1≥W2). The bottom ends of the pair of dummy vertical channel structures DVS may correspond to bottom ends of a pair of the dummy semiconductor pillars DSP adjacent to each other in the second direction Y.

The dummy charge storage structure 312 may completely surround outer surfaces of the dummy vertical channel portion DVC. The dummy vertical channel portion DVC may be spaced apart from the device isolation layer 20 and the dummy semiconductor pillar DSP. In other words, the dummy vertical channel structures DVS may not be electrically connected to the substrate 100.

The dummy vertical channel structures DVS of FIGS. 10 to 12 may exist together with the dummy vertical channel structures DVS described in the above embodiments in a semiconductor memory device. In these configurations, the dummy semiconductor pillar DSP may be formed on a portion of the substrate 100 being in contact with the sidewall 21 and/or a portion of the substrate 100 being in contact with the bottom surface 23 of the device isolation layer 20, and thus a gate insulating layer 340 (see FIGS. 3 and 5) may not be formed on a sidewall of the dummy semiconductor pillar DSP. As a result, a breakdown phenomenon between the ground selection gate electrode 220*a* (see FIG. 10) and the dummy vertical channel structure DVS (see FIG. 10) may be prevented. In addition, since the dummy vertical channel structures DVS may not be electrically connected to the substrate 100, a voltage applied to the substrate 100 may not affect the cell gate electrodes 220*b* (see FIG. 10), and thus electrical characteristics of the semiconductor memory device (e.g. a 3D semiconductor memory device) may be enhanced.

Figure 13:
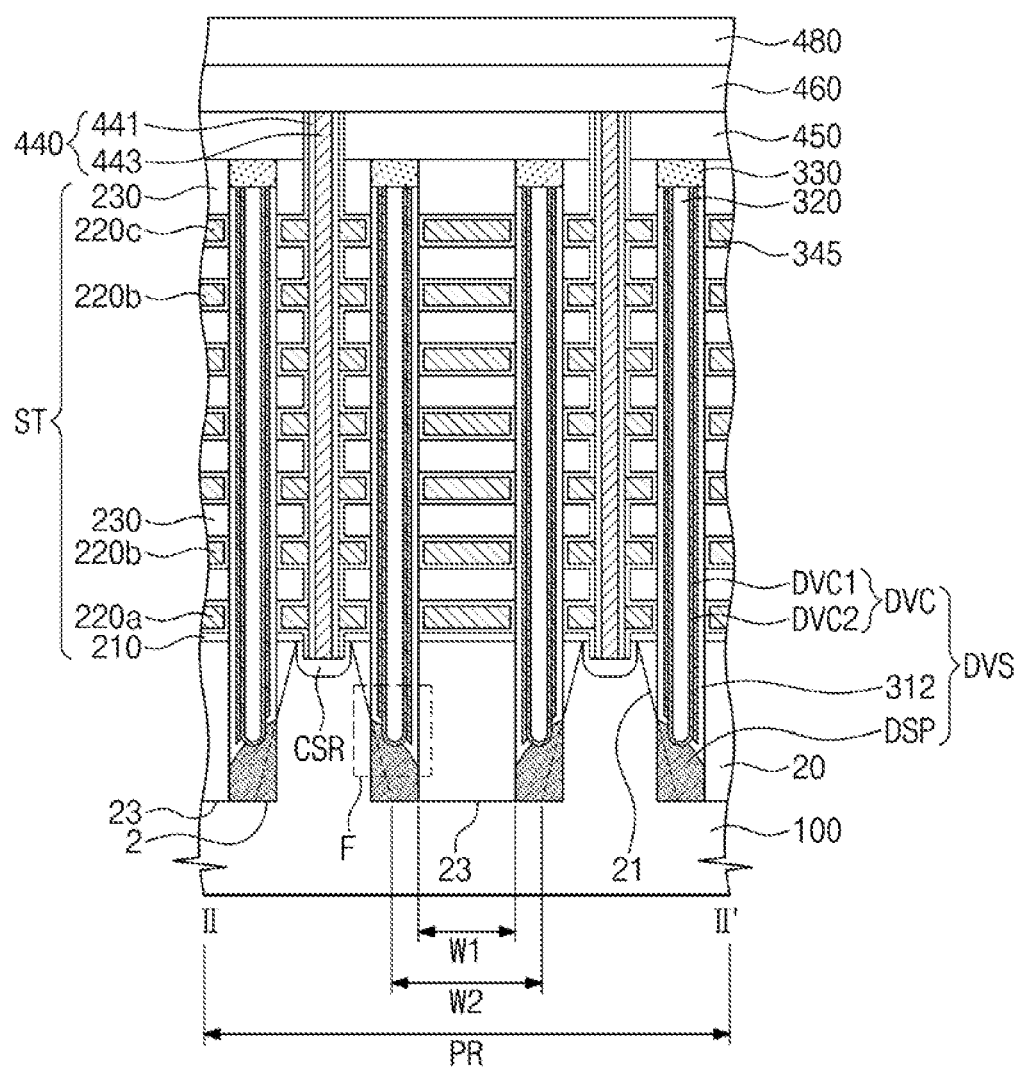
FIG. 13 is a cross-sectional view taken along line II-II' of FIG. 2 to illustrate a semiconductor memory device according to an exemplary embodiment of the present inventive concept.
Figure 14:
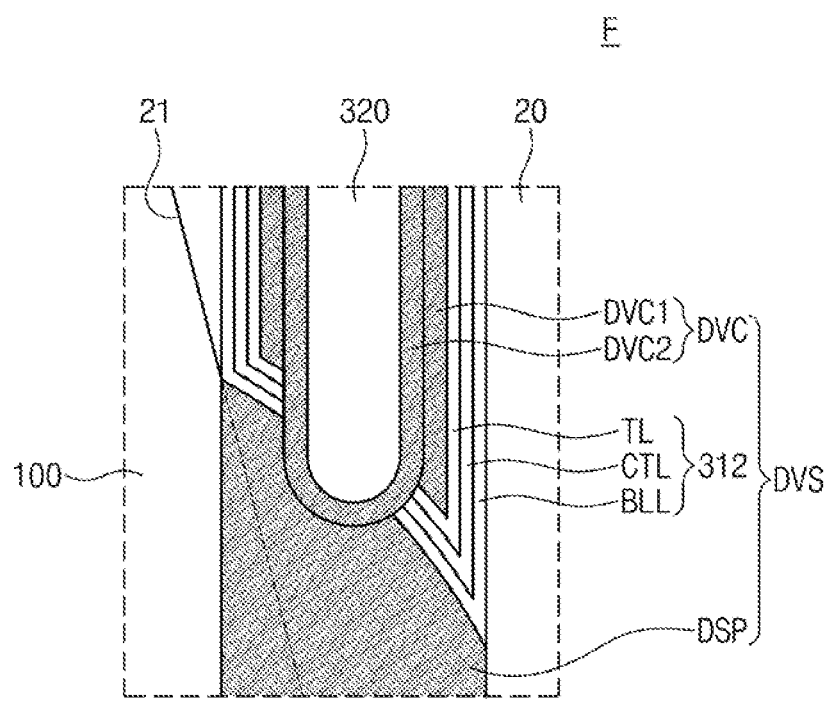
FIG. 14 is an enlarged view of portion 'F' of FIG. 13.

FIG. 13 is a cross-sectional view taken along line IMF of FIG. 2 to illustrate a semiconductor memory device according to an exemplary embodiment of the present inventive concept. FIG. 14 is an enlarged view of portion 'F' of FIG. 13. Hereinafter, the same elements or components as described in the above exemplary embodiments will be indicated by the same reference numerals or the same reference designators, and the descriptions thereto will be omitted or mentioned briefly for the purpose of ease and convenience in explanation.

Referring to FIGS. 13 and 14, dummy vertical channel structures DVS may penetrate the stack structure ST and a portion of the sidewall 21 of the device isolation layer 20. Lower portions of the dummy vertical channel structures DVS may be in contact with the substrate 100, and may correspond to the dummy semiconductor pillars DSP. For example, the dummy semiconductor pillars DSP may penetrate a portion of the sidewall 21 of the device isolation layer 20 to be in contact with the substrate 100.

The dummy vertical channel portion DVC may penetrate the dummy charge storage structure 312 so as to be in contact with the dummy semiconductor pillar DSP and may be spaced apart from the device isolation layer 20. For example, the second dummy channel portion DVC2 may penetrate the first dummy channel portion DVC1 and the dummy charge storage structure 312 so as to be in contact with the dummy semiconductor pillar DSP. The second dummy channel portion DVC2 may penetrate a portion of the top surface of the dummy semiconductor pillar DSP. In other words, a lower portion of the second dummy channel portion DVC2 may be disposed in the dummy semiconductor pillar DSP. Thus, the dummy vertical channel structures DVS may be electrically connected to the substrate 100.

The dummy vertical channel structures DVS of FIGS. 13 and 14 may exist together with the dummy vertical channel structures DVS described in the above exemplary embodiments in a semiconductor memory device. Thus, the dummy semiconductor pillar DSP may be formed on a portion of the substrate 100 being in contact with the sidewall 21 and a portion of the substrate 100 being in contact with the bottom surface 23 of the device isolation layer 20, and thus a gate insulating layer 340 (see FIGS. 3 and 5) may not be formed on a sidewall of the dummy semiconductor pillar DSP. As a result, a breakdown phenomenon between the ground selection gate electrode 220*a* (see FIG. 13) and the dummy vertical channel structure DVS (see FIG. 13) may be prevented.

Figure 15:
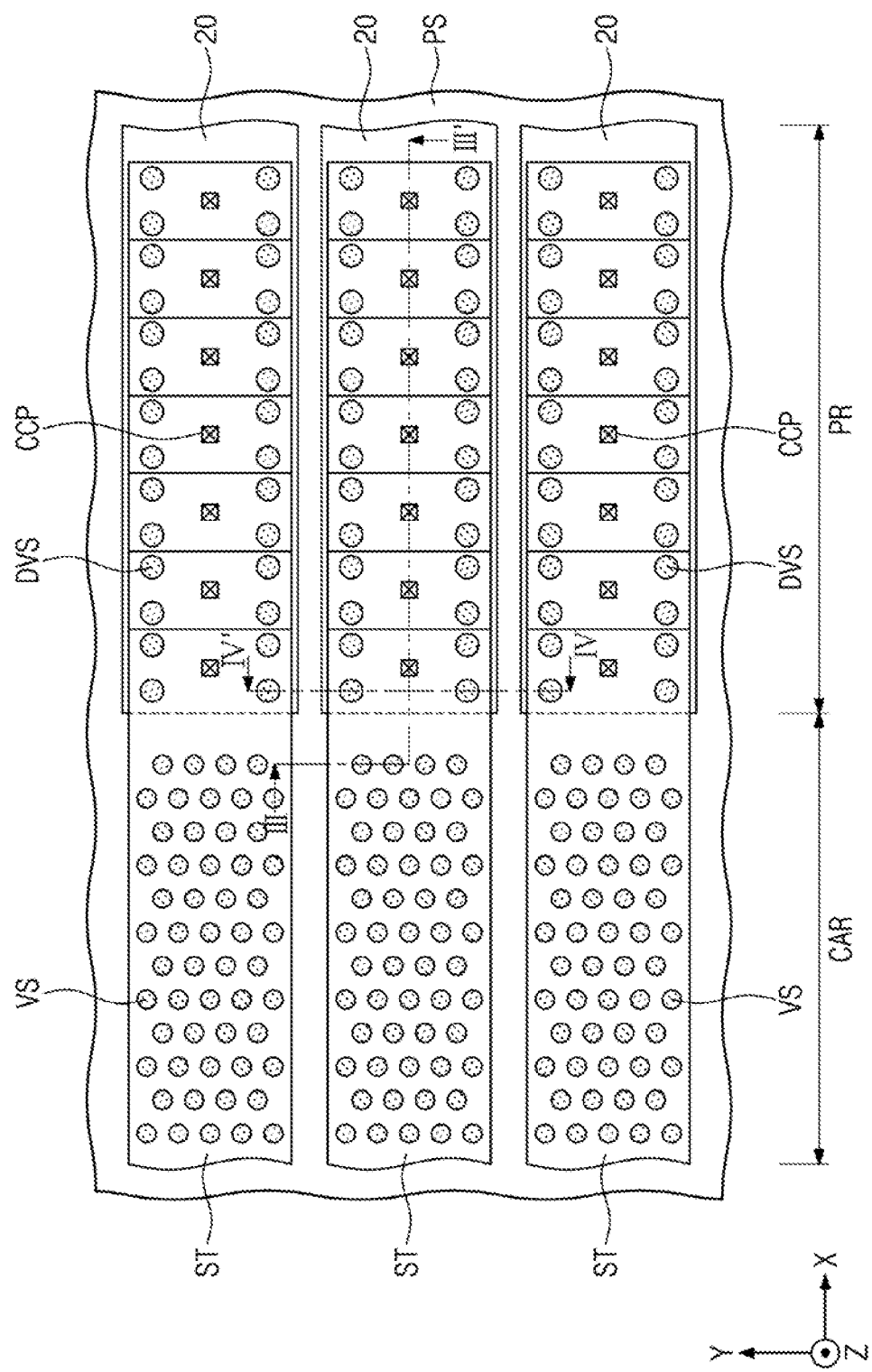
FIG. 15 is a plan view illustrating a semiconductor memory device according to an exemplary embodiment of the present inventive concept.
Figure 16:
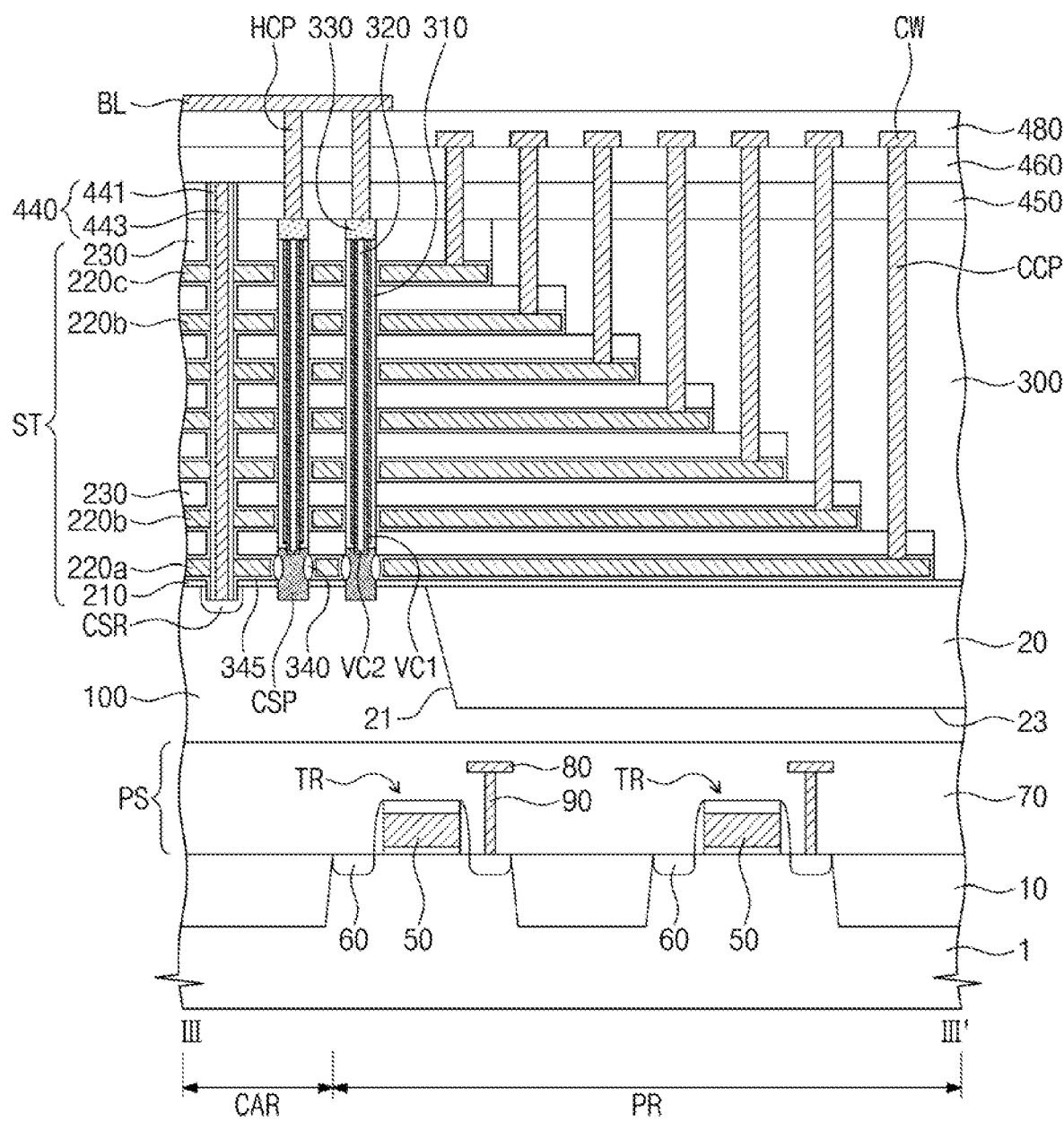
FIG. 16 is a cross-sectional view taken along line of FIG. 15 to illustrate a semiconductor memory device according to an exemplary embodiment of the present inventive concept.
Figure 17:
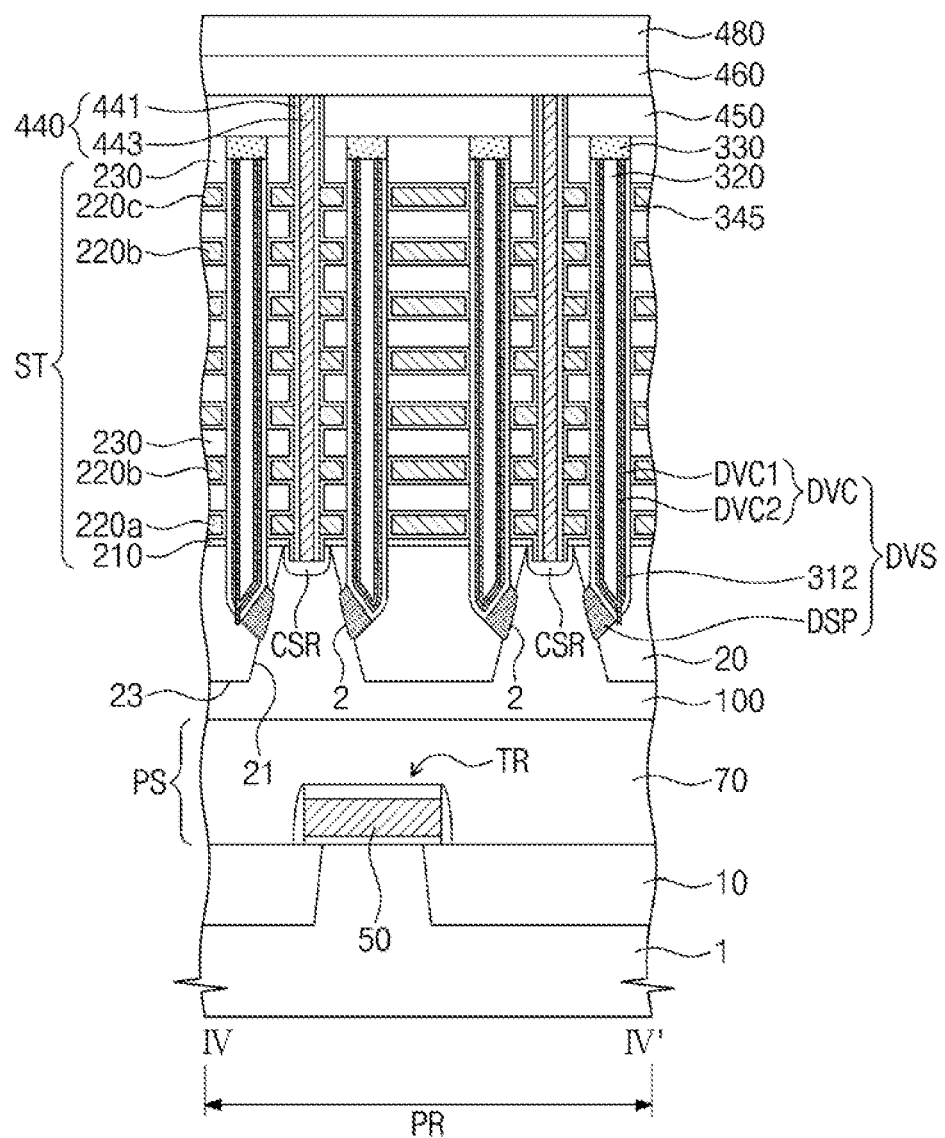
FIG. 17 is a cross-sectional view taken along line IV-IV' of FIG. 15 to illustrate a semiconductor memory device according to an exemplary embodiment of the present inventive concept.

FIG. 15 is a plan view illustrating a semiconductor memory device according to an exemplary embodiment of the present inventive concept. FIG. 16 is a cross-sectional view taken along line of FIG. 15 to illustrate a semiconductor memory device according to an exemplary embodiment of the present inventive concept. FIG. 17 is a cross-sectional view taken along line IV-IV' of FIG. 15 to illustrate a semiconductor memory device according to an exemplary embodiment of the present inventive concept. Hereinafter, the same elements or components as described in the above exemplary embodiments will be indicated by the same reference numerals or the same reference designators, and the descriptions thereto will be omitted or mentioned briefly for the purpose of ease and convenience in explanation.

Referring to FIGS. 15, 16 and 17, a semiconductor memory device may include a first substrate 1, a peripheral circuit structure PS disposed on the first substrate 1, a second substrate 100 disposed on the peripheral circuit structure PS, and stack structures ST disposed on the second substrate 100. The stack structures ST may vertically overlap the peripheral circuit structure PS.

The first substrate 1 may include a silicon (Si) substrate, a silicon-germanium (SiGe) substrate, a germanium (Ge) substrate, a III-V compound semiconductor substrate, a single-crystalline epitaxial layer grown on a single-crystalline silicon (Si) substrate, or a combination thereof. Any suitable III-V compound semiconductor may be used for the substrate 1 and may include, for example, gallium arsenide (GaAs), indium gallium arsenide (InGaAs), aluminum gallium arsenide (AlGaAs), or a combination thereof. A peripheral circuit device isolation layer 10 may be disposed in the first substrate 1, and may define active regions of the first substrate 1. The peripheral circuit device isolation layer 10 may include an insulating material (e.g., silicon oxide ($SiO_2$)).

The peripheral circuit structure PS may be disposed on the first substrate 1, and may include peripheral circuit transistors TR, a peripheral circuit interlayer insulating layer 70, interconnection lines 80, and vias 90. The peripheral circuit transistors TR may be disposed on the active regions of the first substrate 1 defined by the peripheral circuit device isolation layer 10. The peripheral circuit interlayer insulating layer 70 may be disposed on the first substrate 1, and may cover the peripheral circuit transistors TR. The peripheral circuit interlayer insulating layer 70 may include a single layer or a plurality of layers. For example, the peripheral circuit interlayer insulating layer 70 may include a silicon oxide ($SiO_2$) layer. The interconnection lines 80 and the vias 90 may be disposed in the peripheral circuit interlayer insulating layer 70. The vias 90 may electrically connect source/drain regions 60 of the peripheral circuit transistors TR to the interconnection lines 80. The interconnection lines 80 and the vias 90 may include a metal material (e.g., copper (Cu)).

The second substrate 100 may be disposed on the peripheral circuit structure PS, and may include a cell array region CAR and a pad region PR. A device isolation layer 20 may be disposed in the second substrate 100. The device isolation layer 20 may be disposed in the pad region PR of the second substrate 100 and may vertically overlap each of the stack structures ST disposed on the pad region PR of the second substrate 100. Each of the stack structures ST may have a stepwise structure on the pad region PR of the substrate 100 for electrical connections between gate electrodes 220a, 220b and 220c and the peripheral circuit structure PS. Cell vertical channel structures VS may penetrate the stack structures ST disposed on the cell array region CAR of the second substrate 100. Dummy vertical channel structures DVS may penetrate end portions of the stack structures ST disposed on the pad region PR of the second substrate 100. The cell and dummy vertical channel structures VS and DVS may be substantially the same as those described above with reference to FIGS. 2 to 7, and thus the descriptions thereto are omitted.

FIGS. 18A to 22A are cross-sectional views taken along line I-I' of FIG. 2 to illustrate a method of manufacturing a semiconductor memory device according to an exemplary embodiment of the present inventive concept. FIGS. 18B to 22B are cross-sectional views taken along line II-II' of FIG. 2 to illustrate a method of manufacturing a semiconductor memory device according to an exemplary embodiment of the present inventive concept.

Figure 18B:
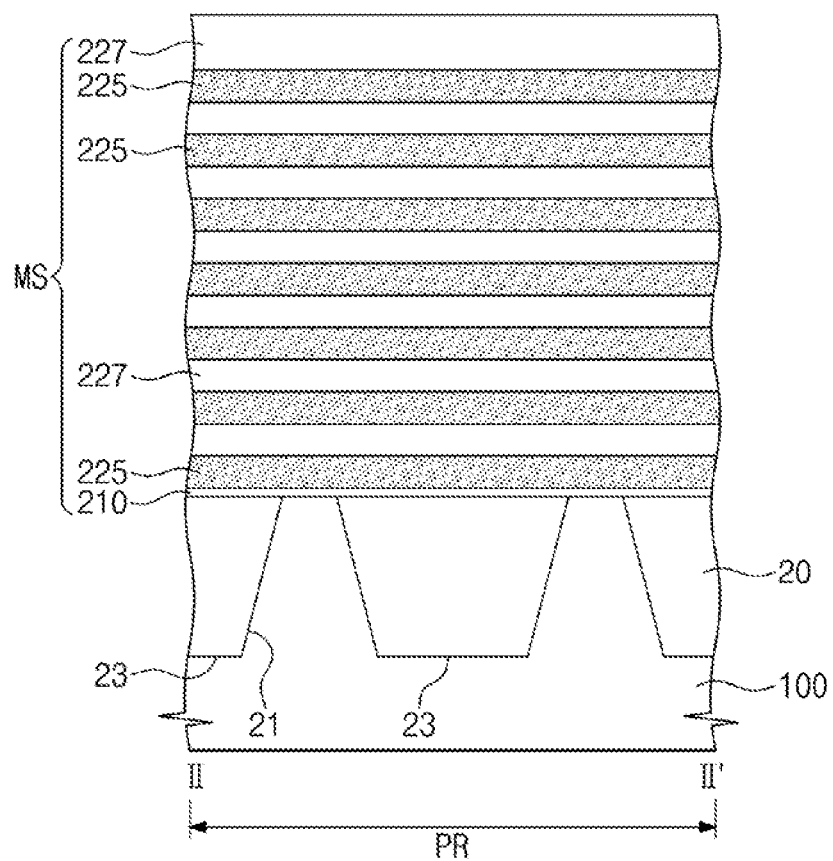

Referring to FIGS. 18A and 18B, a device isolation layer 20 may be formed in a substrate 100. The substrate 100 may include a cell array region CAR, a peripheral circuit region PER, and a pad region PR located between the cell array region CAR and the peripheral circuit region PER. The device isolation layer 20 may be formed in the pad region PR and the peripheral circuit region PER of the substrate 100, and may be formed to vertically overlap each of stack structures ST to be formed in subsequent processes. The device isolation layer 20 may have sidewalls 21 and a bottom surface 23, and may define active regions of the substrate 100 in the peripheral circuit region PER of the substrate 100. A mask pattern may be formed on the substrate 100. The substrate 100 may be etched using the mask pattern as an etch mask to form a trench, and then, the device isolation layer 20 may be formed by filling the trench with an insulating material. The device isolation layer 20 may include, for example, a silicon oxide ($SiO_2$) layer.

A peripheral circuit transistor TR (see FIG. 2) may be formed on the peripheral circuit region PER of the substrate 100, and may be formed on the active region of the substrate 100. The peripheral circuit transistor TR may include a peripheral gate insulating layer, a peripheral gate electrode 50, and source/drain regions 60.

A mold structure MS may be formed on the substrate 100. The formation of the mold structure MS may include forming a buffer oxide layer 210 on the substrate 100, and alternately and repeatedly stacking sacrificial layers 225 and insulating layers 227 on the buffer oxide layer 210. The buffer oxide layer 210 may cover the peripheral circuit region PER of the substrate 100. For example, the buffer oxide layer 210 may include a thermal oxide layer or a silicon oxide ($SiO_2$) layer. For example, the buffer oxide layer 210 may be formed through thermal oxidation of the substrate 100 such as a silicon (Si) substrate to form the silicon oxide ($SiO_2$) layer or through deposition of the silicon oxide ($SiO_2$) layer to cover the substrate 100. Each of the sacrificial layers 225 may include, for example, a silicon nitride ($Si_3N_4$) layer. The insulating layers 227 may be formed of a material having an etch selectivity with respect to that of the sacrificial layers 225, and vice versa. Each of the insulating layers 227 may include, for example, a silicon oxide ($SiO_2$) layer.

The mold structure MS formed on the pad region PR of the substrate 100 may be patterned to have a stepwise structure. The patterning of the mold structure MS may include forming a mask pattern, which exposes a portion of the mold structure MS formed on the pad region PR and the peripheral circuit region PER of the substrate 100, on the mold structure MS, etching the insulating layers 227 and the sacrificial layers 225 by using the mask pattern as an etch mask, and reducing a width of the mask pattern to increase exposed planar areas of the insulating and sacrificial layers 227 and 225 to be etched. At this time, the etching of the insulating and sacrificial layers 227 and 225 and the reducing of the width of the mask pattern may be alternately repeated. The buffer oxide layer 210 on the peripheral circuit region PER may be exposed by the mold structure MS. For example, some portion of the mold structure MS may be completely removed to reach a top surface of the buffer oxide layer 210. In addition, top surfaces of end portions of the insulating layers 227 may be exposed on the pad region PR of the substrate 100. Lengths of the sacrificial layers 225 in the first direction X (see FIG. 2) may decrease sequentially as a vertical distance from the substrate 100 increases. Likewise, lengths of the insulating layers 227 in the first direction X may decrease sequentially as a vertical distance from the substrate 100 increases. The lengths, in the first direction X, of the sacrificial layer 225 and the insulating layer 227 thereabove vertically adjacent to each other may be substantially equal to each other. For example, for the adjacent pair of the sacrificial layer 225 and the insulating layer 227 having the same length, the insulating layer 227 is located above the sacrificial layer 225.

An interlayer insulating pattern 300 may be formed to cover the stepwise structure of the mold structure MS and the buffer oxide layer 210, and may expose a top surface of the mold structure MS. For example, a top surface of the interlayer insulating pattern 300 may be coplanar with the top surface of the mold structure MS. The interlayer insulating pattern 300 may include, for example, a tetraethyl orthosilicate (TEOS) oxide layer.

Figure 19A:
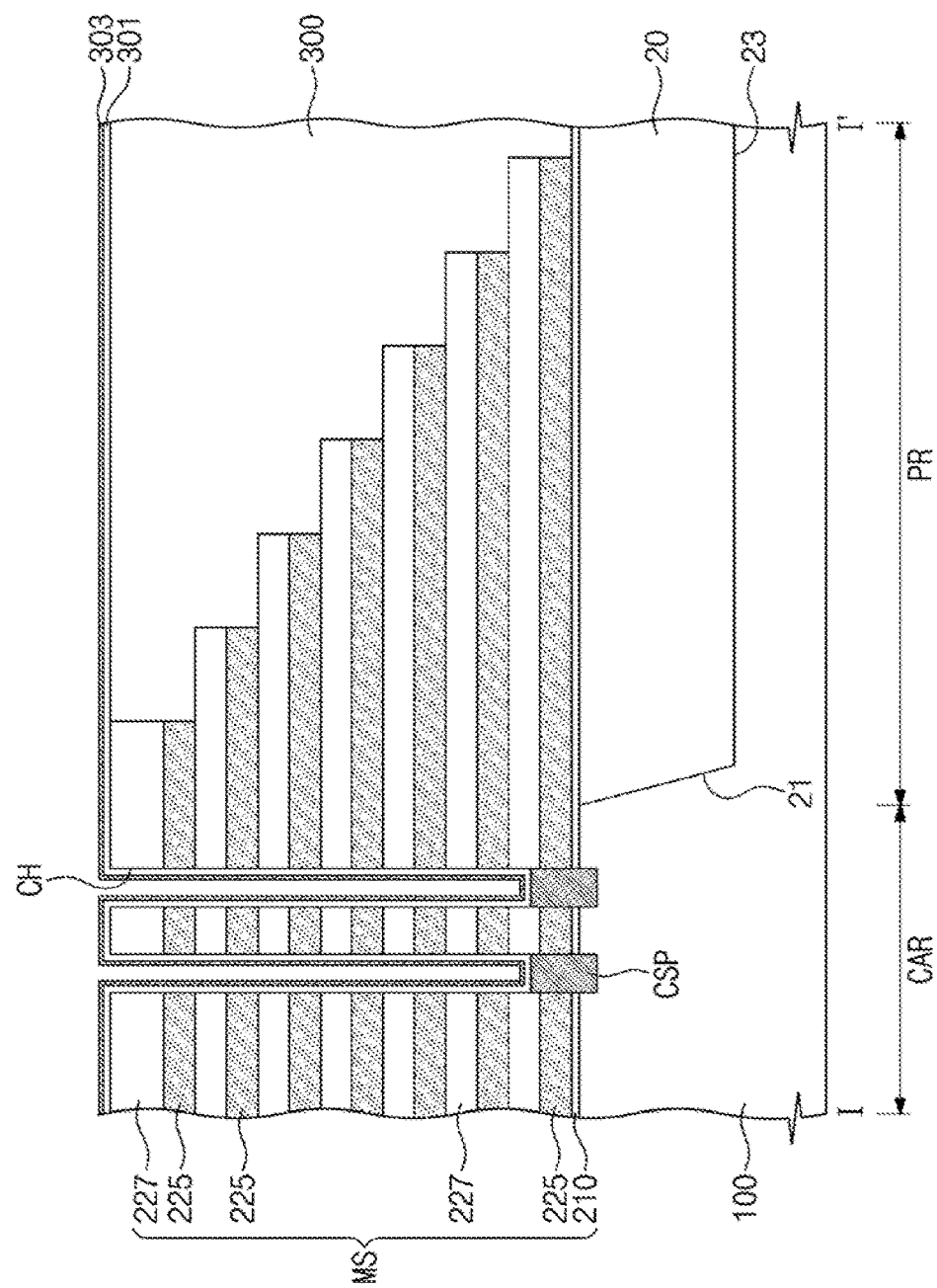
Figure 19B:
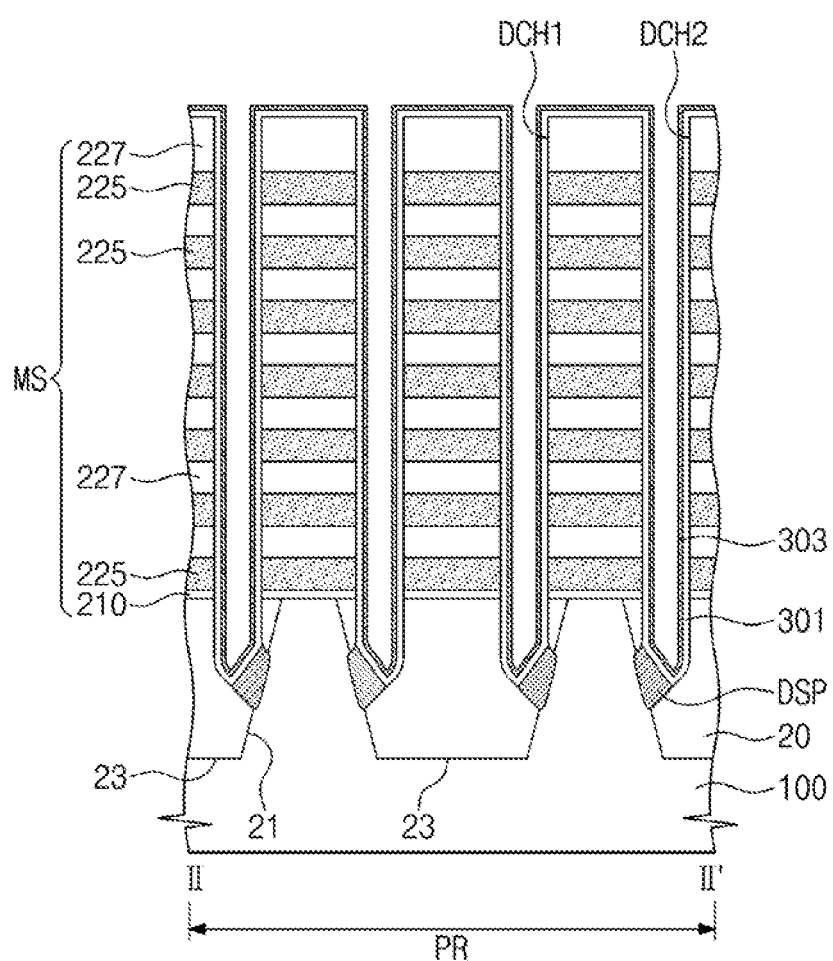

Referring to FIGS. 19A and 19B, the mold structure MS and the buffer oxide layer 210 may be patterned to form channel holes CH and dummy channel holes DCH1 and DCH2 in the mold structure MS. The channel holes CH may be formed on the cell array region CAR of the substrate 100, and the dummy channel holes DCH1 and DCH2 may be formed on the pad region PR of the substrate 100. A mask pattern may be formed on the mold structure MS and the interlayer insulating pattern 300, and then, the mold structure MS and the interlayer insulating pattern 300 may be anisotropically etched using the mask pattern as an etch mask to form the channel holes CH and the dummy channel holes DCH1 and DCH2. The channel holes CH may be formed by anisotropically etching the mold structure MS. A top surface of the substrate 100 under the channel holes CH may be recessed by over-etching. In other words, bottom surfaces of the channel holes CH may be lower than the top surface of the substrate 100. The channel holes CH and the dummy channel holes DCH1 and DCH2 may have, for example, circular shapes, elliptical shapes, or polygonal shapes when viewed in a plan view.

The number of deposition layers etched for forming the dummy channel holes DCH1 and DCH2 may be greater than the number of deposition layers etched for forming the channel holes CH, and thus widths of the dummy channel holes DCH1 and DCH2 may be greater than widths of the channel holes CH, and depths of the dummy channel holes DCH1 and DCH2 may be greater than depths of the channel holes CH. For example, the dummy channel holes DCH1 and DCH2 may be formed by anisotropically etching the mold structure MS, the interlayer insulating pattern 300, and the device isolation layer 20.

In an exemplary embodiment of the present inventive concept, in the device isolation layer 20, the dummy channel holes DCH1 and DCH2 may be respectively formed on the sidewalls 21 of the device isolation layer 20 adjacent thereto. The anisotropic etching process may be a dry etching process that uses plasma in a state in which a voltage is applied to the substrate 100. When the device isolation layer 20 is etched, ions in the plasma may move toward the substrate 100 which is in contact with the sidewalls 21 of the device isolation layer 20 and is supplied with the voltage. The vicinity of the portion of the substrate 100 being in contact with the sidewalls 21 of the device isolation layer 20 to the ions in the plasma provides the strongest electric field to the ions, thereby attracting the ions to move toward this portion of the substrate 100. In this case, for example, the dummy channel holes DCH1 and DCH2 may be formed to be bent to the sidewalls 21 of the device isolation layer 20 adjacent thereto in the device isolation layer 20. In an exemplary embodiment of the present inventive concept, lower portions of the dummy channel holes DCH1 and DCH2 may penetrate portions of the sidewalls 21 of the device isolation layer 20 adjacent thereto, and upper portions of the dummy channel holes DCH1 and DCH2 may be formed vertically with respect to the top surface of the substrate 100. In the pad region PR of the substrate 100, portions of the substrate 100 being in contact with the sidewalls 21 of the device isolation layer 20 may be etched by over-etching, and thus bottom surfaces of the dummy channel holes DCH1 and DCH2 may be recessed from the sidewalls 21 of the device isolation layer 20. For example, the lower portions of the dummy channel holes DCH1 and DCH2 may be recessed into the portions of the substrate 100 being in contact with the sidewalls 21 of the device isolation layer 20. The bottom surfaces of the dummy channel holes DCH1 and DCH2 may be inclined or parallel with respect to the top surface of the substrate 100.

Cell semiconductor pillars CSP may be formed in the channel holes CH, and dummy semiconductor pillars DSP may be formed in the dummy channel holes DCH1 and DCH2. The cell semiconductor pillars CSP may fill lower portions of the channel holes CH, and the dummy semiconductor pillars DSP may fill lower portions of the dummy channel holes DCH1 and DCH2. The cell semiconductor pillars CSP and the dummy semiconductor pillars DSP may be grown from the substrate 100 by performing a selective epitaxial growth process using the substrate 100, exposed by the channel holes CH and the dummy channel holes DCH1 and DCH2, as a seed. The cell and dummy semiconductor pillars CSP and DSP may include a semiconductor material having a conductivity type the same as that of the substrate 100. In an exemplary embodiment of the present inventive concept, the cell semiconductor pillars CSP grown from the substrate 100 exposed by the channel holes CH may have top surfaces that are substantially parallel to the top surface of the substrate 100. The dummy semiconductor pillars DSP grown from the substrate 100 exposed by the dummy channel holes DCH1 and DCH2 may have top surfaces that are inclined with respect to the top surface of the substrate 100.

A charge storage structure layer 301 and a first vertical channel layer 303 may be sequentially formed to cover sidewalls of the channel holes CH, sidewalls of the dummy channel holes DCH1 and DCH2, the top surfaces of the cell semiconductor pillars CSP, and the top surfaces of the dummy semiconductor pillars DSP. The charge storage structure layer 301 and the first vertical channel layer 303 may also cover a top surface of an uppermost one of the insulating layers 227. The charge storage structure layer 301 and the first vertical channel layer 303 may be conformally formed to have thicknesses that do not completely fill the channel holes CH and the dummy channel holes DCH1 and DCH2. As illustrated in FIGS. 5 to 7, the charge storage structure layer 301 may include a blocking insulating layer BLL, a charge storage layer CTL and a tunnel insulating layer TL which are sequentially formed on the sidewall of each of the channel holes CH and the dummy channel holes DCH1 and DCH2. For example, the blocking insulating layer BLL may include a silicon oxide ($SiO_2$) layer and/or a high-k dielectric layer (e.g., aluminum oxide ($Al_2O_3$) or hafnium oxide ($HfO_2$)), the charge storage layer CTL may include a silicon nitride ($Si_3N_4$) layer, and the tunnel insulating layer TL may include a silicon oxide ($SiO_2$) layer and/or a high-k dielectric layer (e.g., aluminum oxide ($Al_2O_3$) or hafnium oxide ($HfO_2$)). The first vertical channel layer 303 may be, for example, a poly-crystalline silicon (Si) layer. Alternatively, the first vertical channel layer 303 may include an organic semiconductor layer or a carbon (C) nano-structure. The charge storage structure layer 301 and the first vertical channel layer 303 may be formed using, for example, an atomic layer deposition (ALD) process and/or a chemical vapor deposition (CVD) process.

Figure 20A:
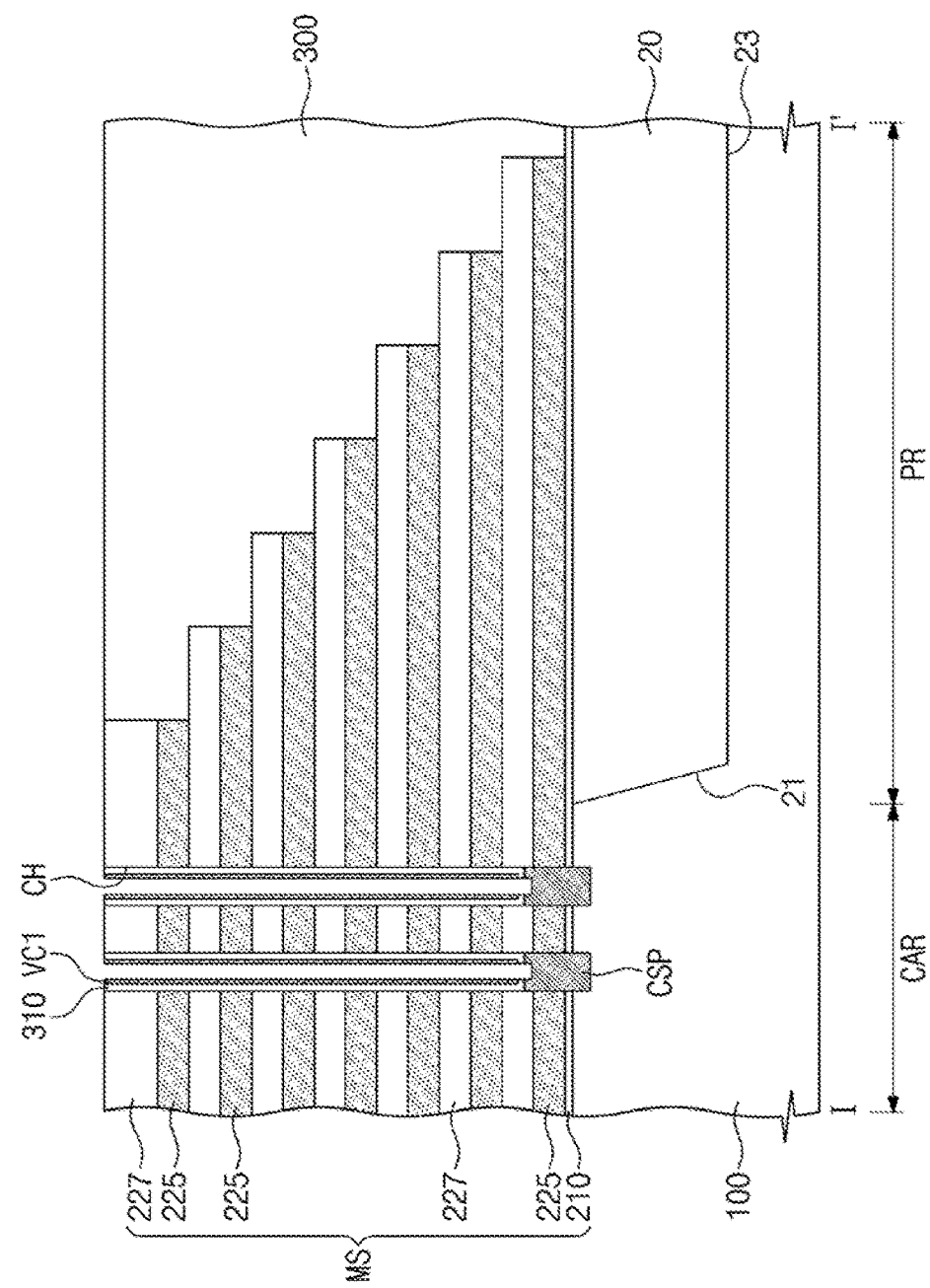
Figure 20B:
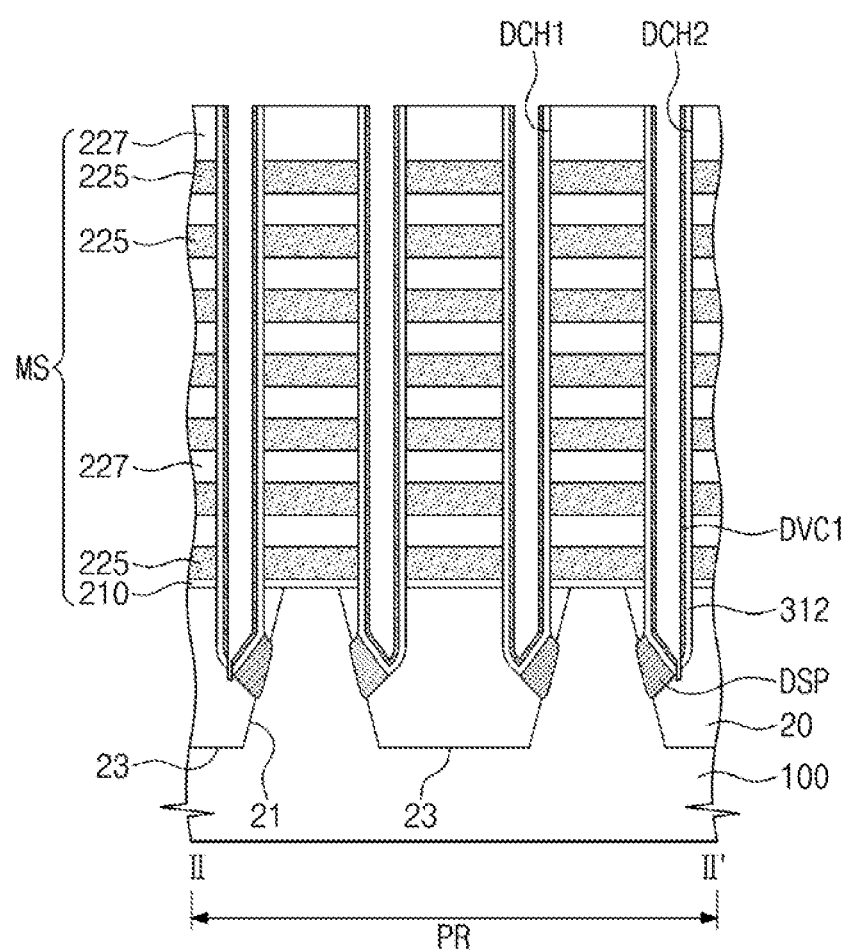

Referring to FIGS. 20A and 20B, an anisotropic etching process may be performed to etch the charge storage structure layer 301 and the first vertical channel layer 303 which cover the top surfaces of the cell semiconductor pillars CSP. After the performing of the anisotropic etching process, the charge storage structure layer 301 and the first vertical channel layer 303 on the uppermost insulating layer 227 may be removed to expose the top surface of the uppermost insulating layer 227. A cell charge storage structure 310 and a first vertical channel portion VC1 may be formed in each of the channel holes CH, and a dummy charge storage structure 312 and a first dummy channel portion DVC1 may be formed in each of the dummy channel holes DCH1 and DCH2. By the etching process, portions of the top surfaces of the cell semiconductor pillars CSP may be recessed by over-etching. The etching process may be a vertical dry etching process capable of vertically etching a target layer. In the vertical dry etching process, an etch rate in a direction parallel to the top surface of the substrate 100 may be substantially zero (0). For example, the etching process may be an etch-back process. For example, the vertical dry etching process may include reactive ion etching (ME) process.

In an exemplary embodiment of the present inventive concept, the dummy channel holes DCH1 and DCH2 may include a first dummy channel hole DCH1 and a second dummy channel hole DCH2. The charge storage structure layer 301 and the first vertical channel layer 303 on the top surface of the dummy semiconductor pillar DSP may not be etched in the first dummy channel hole DCH1. For example, the charge storage structure layer 301 and the first vertical channel layer 303 on the top surface of the dummy semiconductor pillar DSP in the first dummy channel hole DCH1 may not be parallel to the top surface of the substrate 100 and thus may not be etched by the etching process having the vertical etching characteristics. Portions of the charge storage structure layer 301 and the first vertical channel layer 303 on the top surface of the dummy semiconductor pillar DSP may be etched in the second dummy channel hole DCH2. For example, the portions of the charge storage structure layer 301 and the first vertical channel layer 303 in the second dummy channel hole DCH2 may be parallel to the top surface of the substrate 100 and thus may be etched by the etching process having the vertical etching characteristics. Whether the charge storage structure layer 301 and the first vertical channel layer 303 on the top surface of the dummy semiconductor pillar DSP will be etched or not may depend on the shapes and profiles of the dummy channel holes DCH1 and DCH2 formed in the fabrication process. In this case, a portion of the second dummy channel hole DCH2 may extend into the device isolation layer 20, and thus the device isolation layer 20 may be exposed by the portion of the second dummy channel hole DCH2. At the same time, the dummy semiconductor pillar DSP in the second dummy channel hole DCH2 may not be exposed by the portion of the second dummy channel hole DCH2. Alternatively, the dummy semiconductor pillar DSP in the second dummy channel hole DCH2 may be exposed by the portion of the second dummy channel hole DCH2 which extends into the device isolation layer 20.

Figure 21A:
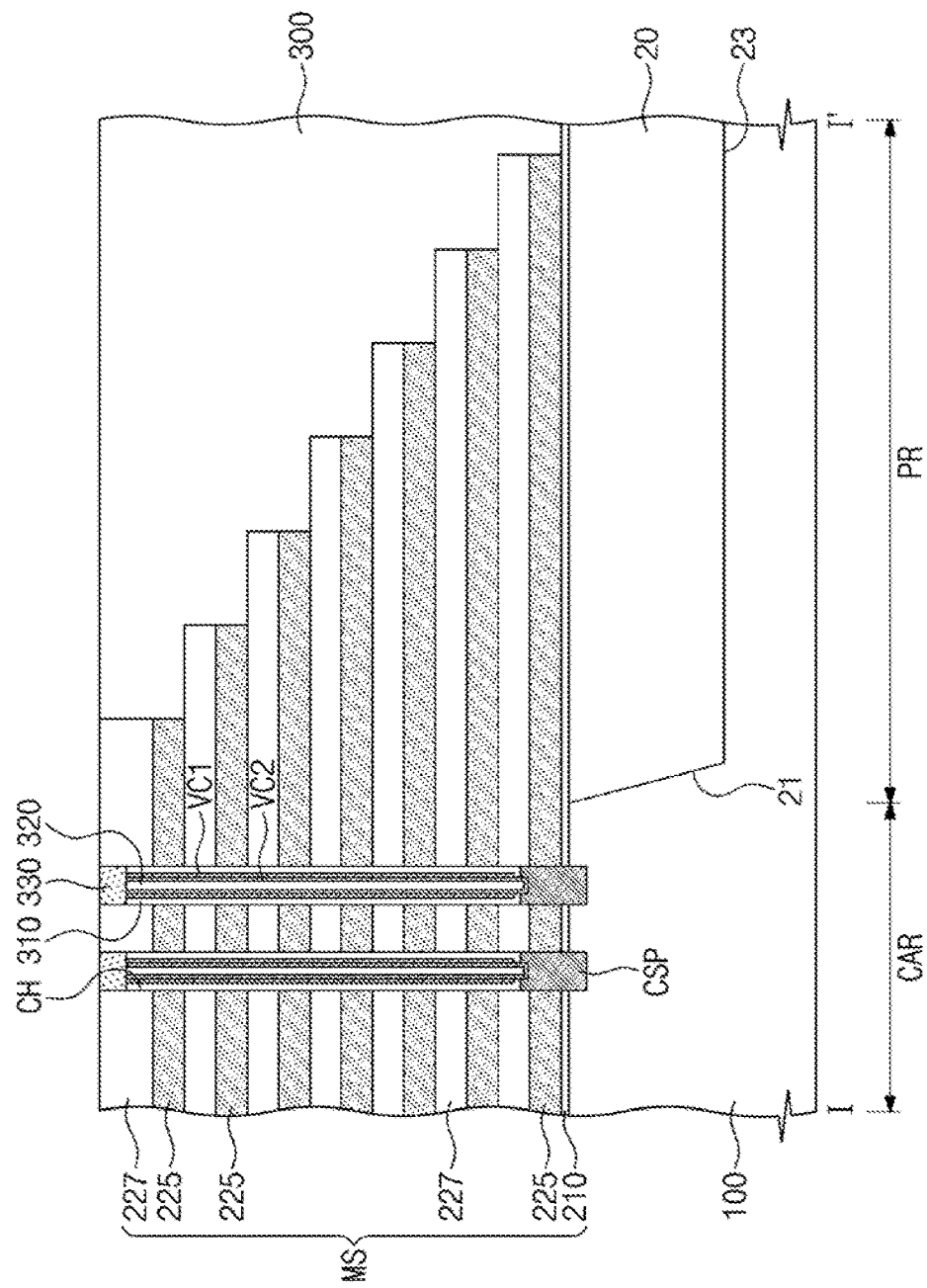
Figure 21B:
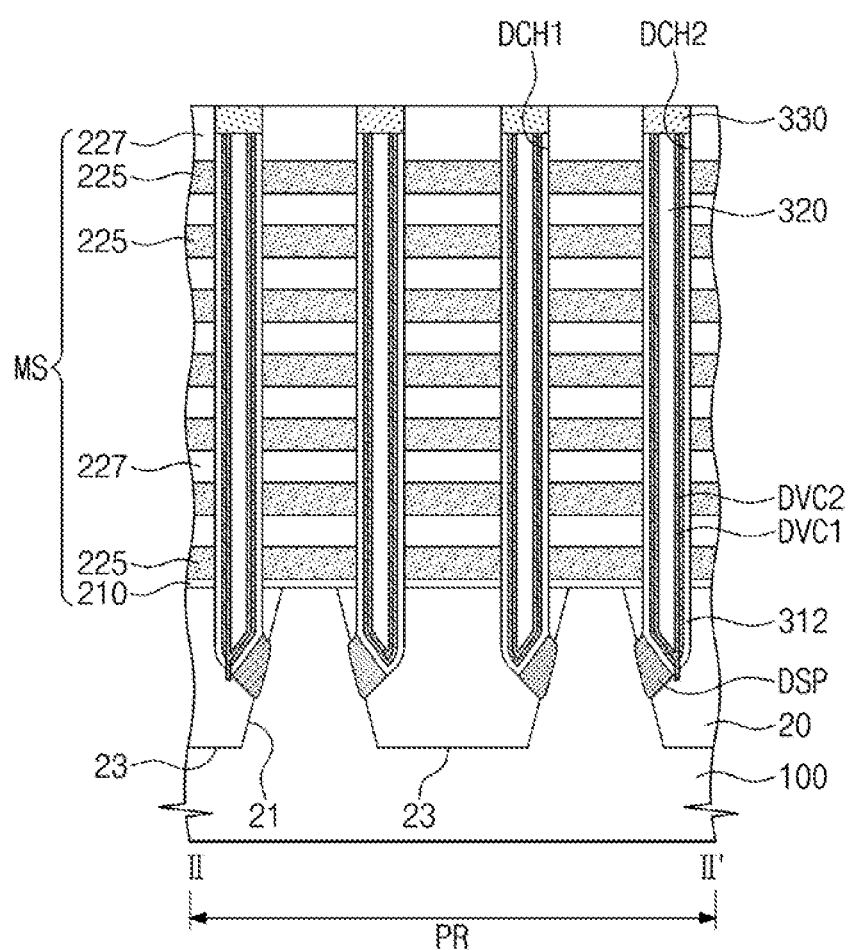

Referring to FIGS. 21A and 21B, a second vertical channel portion VC2 may be formed in each of the channel holes CH, and a second dummy channel portion DVC2 may be formed in each of the dummy channel holes DCH1 and DCH2. The second vertical channel portion VC2 may conformally cover an inner sidewall of the first vertical channel portion VC1 and may be in contact with the cell semiconductor pillar CSP. The second dummy channel portion DVC2 may conformally cover inner surfaces of the first dummy channel portion DVC1. In an exemplary embodiment of the present inventive concept, the second vertical channel portion VC2 and the second dummy channel portion DVC2 may be conformally formed to have thicknesses that do not completely fill each of the channel holes CH and each of the dummy channel holes DCH1 and DCH2, respectively. Accordingly, the second vertical channel portion VC2 and the second dummy channel portion DVC2 may define an empty space (or gap) in each of the channel holes CH and each of the dummy channel holes DCH1 and DCH2, respectively, and the empty space may be filled with a gap-fill layers 320 to be described or air. However, the present inventive concept is not limited thereto. For example, in an exemplary embodiment of the present inventive concept, the second vertical channel portion VC2 and the second dummy channel portion DVC2 may be formed to completely fill each of the channel holes CH and each of the dummy channel holes DCH1 and DCH2, respectively. In an exemplary embodiment of the present inventive concept, the second dummy channel portion DVC2 formed in the second dummy channel hole DCH2 may fill the portion of the second dummy channel hole DCH2 which extends into the device isolation layer 20. In the second dummy channel hole DCH2, the second dummy channel portion DVC2 may be in contact with the device isolation layer 20 and may be spaced apart from the dummy semiconductor pillar DSP. The second vertical channel portion VC2 and the second dummy channel portion DVC2 may include, for example, a polycrystalline silicon (Si) layer. Alternatively, the second vertical channel portion VC2 and the second dummy channel portion DVC2 may include an organic semiconductor layer or a carbon (C) nano-structure.

A hydrogen annealing process may be performed on the first and second vertical channel portions VC1 and VC2 and the first and second dummy channel portions DVC1 and DVC2 in a gas atmosphere including hydrogen or heavy hydrogen (deuterium). Crystal defects existing in the vertical and dummy channel portions VC1, VC2, DVC1 and DVC2 may be cured by the hydrogen annealing process.

According to an exemplary embodiment of the present inventive concept, the dummy semiconductor pillar DSP may be formed on a portion of the substrate 100 being in contact with the sidewall 21 of the device isolation layer 20, and thus a gate insulating layer 340 to be described with reference to FIG. 22A may not be formed on a sidewall of the dummy semiconductor pillar DSP. As a result, a breakdown phenomenon between the ground selection gate electrode 220a (see FIG. 4) and the dummy vertical channel structure DVS (see FIG. 4) may be prevented.

According to an exemplary embodiment of the present inventive concept, in the etching process for exposing the top surface of the cell semiconductor pillar CSP from the cell charge storage structure 310, the dummy charge storage structure 312 and the first dummy channel portion DVC1 on the inclined top surface of the dummy semiconductor pillar DSP may not be etched or may be etched in such a way that the top surface of the dummy semiconductor pillar DSP is not exposed. Thus, an additional process of isolating the first and second dummy channel portions DVC1 and DVC2 from the substrate 100 may not be required. In addition, a voltage applied to the substrate 100 may not affect the cell gate electrodes 220b (see FIGS. 3 and 4), and thus electrical characteristics of the semiconductor memory device may be enhanced.

Gap-fill layers 320 may be formed in inner spaces surrounded by the vertical and dummy channel portions VC1, VC2, DVC1 and DVC2. The gap-fill layers 320 may completely fill the channel holes CH and the dummy channel holes DCH1 and DCH2. The gap-fill layers 320 may be formed using a spin-on-glass (SOG) technique. The gap-fill layers 320 may include an insulating material (e.g., silicon oxide ($SiO_2$)). Alternatively, the inner spaces surrounded by the vertical and dummy channel portions VC1, VC2, DVC1 and DVC2 may not be filled with the gap-fill layers 320, and may be left empty and filled with air.

Pads 330 may be formed on the vertical and dummy channel portions VC1, VC2, DVC1 and DVC2. Upper portions of the vertical and dummy channel portions VC1, VC2, DVC1 and DVC2, the cell and dummy charge storage structures 310 and 312 and the gap-fill layers 320 may be etched to form recess regions, and then, the pads 330 may be formed by filling the recess regions with a conductive material. Alternatively, the pads 330 may be formed by doping upper portions of the vertical and dummy channel portions VC1, VC2, DVC1 and DVC2 with dopants of which a conductivity type is different from that of the vertical and dummy channel portions VC1, VC2, DVC1 and DVC2.

Figure 22A:
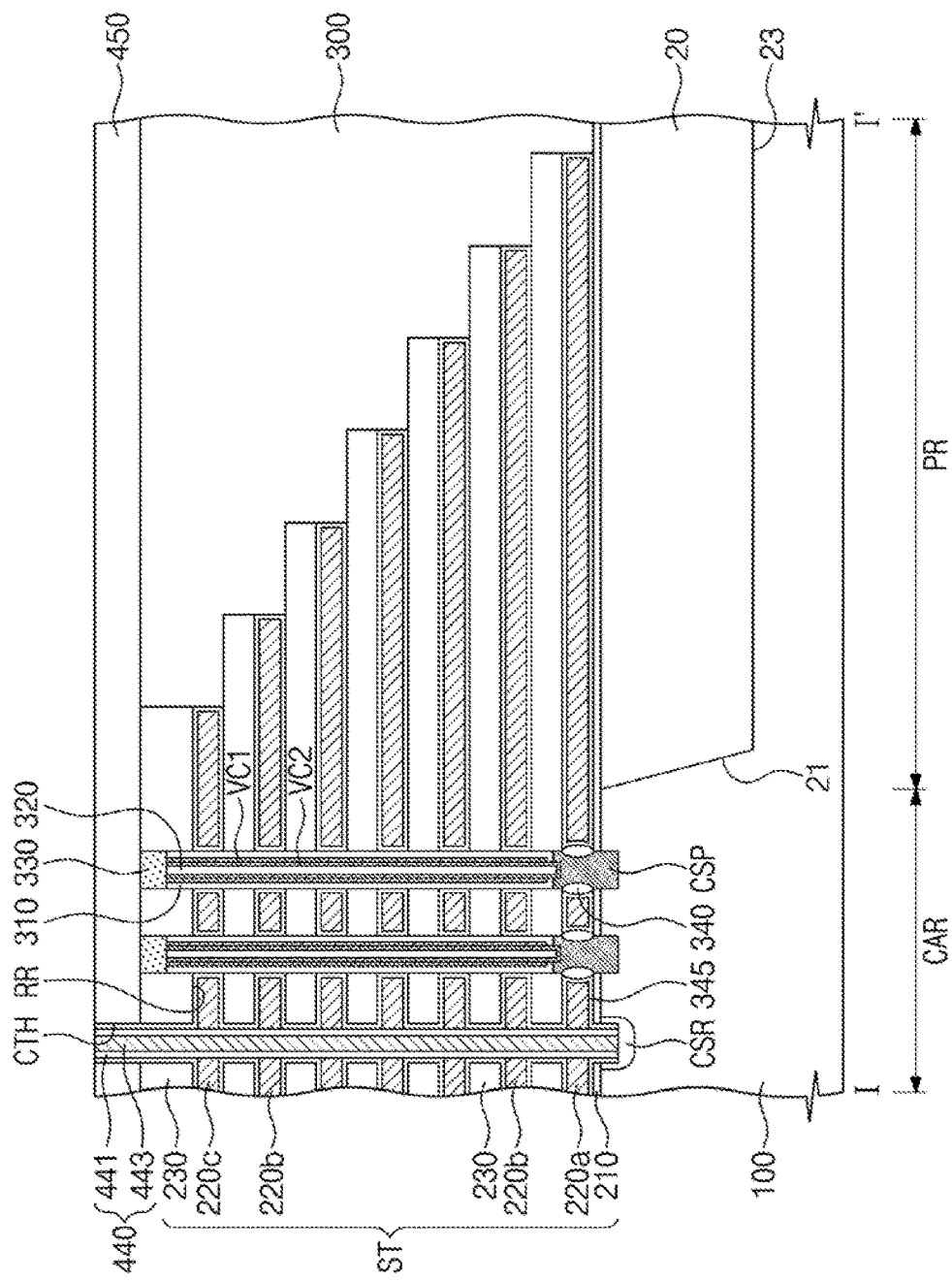
Figure 22B:
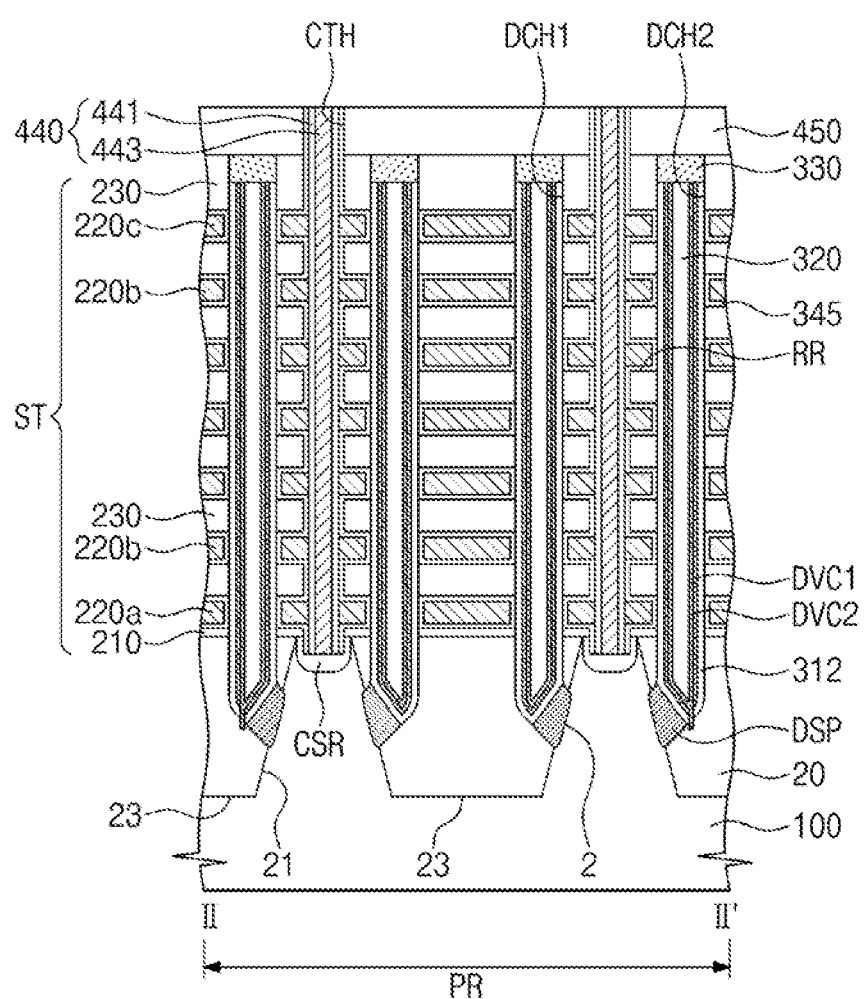

Referring to FIGS. 22A and 22B, an anisotropic etching process may be performed on the mold structure MS to form a common source trench CTH. In an exemplary embodiment of the present inventive concept, a first interlayer insulating layer 450 may be formed on the mold structure MS, and then, the first interlayer insulating layer 450, the mold structure MS and the buffer oxide layer 210 may be patterned until the top surface of the substrate 100 is exposed, thereby forming the common source trench CTH. For the forming of the common source trench CTH, a mask pattern may be formed on the first interlayer insulating layer 450, then the first interlayer insulating layer 450, the mold structure MS and the buffer oxide layer 210 may be etched using the mask pattern as an etch mask to form the common source trench CTH. The common source trench CTH may extend in the first direction X (see FIG. 2). For example, the common source trench CTH may have a linear or rectangular shape extending in the first direction X when viewed in a plan view. Since the common source trench CTH is formed, stack structures ST spaced apart from each other in the second direction Y (see FIG. 2) may be formed on the substrate 100. Each of the stack structures ST may include the patterned buffer oxide layer 210, insulating patterns 230, and sacrificial patterns. Sidewalls of the stack structures ST may be exposed by the common source trench CTH.

The sacrificial patterns exposed by the common source trench CTH may be removed to form recess regions RR. The sacrificial patterns may be removed by performing a wet etching process and/or an isotropic dry etching process. The recess regions RR may be formed between the insulating patterns 230 vertically stacked and between the buffer oxide layer 210 and a lowermost one of the insulating patterns 230. In an exemplary embodiment of the present inventive concept, when the sacrificial patterns are formed of silicon nitride ($Si_3N_4$) and the insulating patterns 230 are formed of silicon oxide ($SiO_2$), the sacrificial patterns may be removed by an etching process using an etching solution including phosphoric acid.

The recess regions RR may laterally extend from the common source trench CTH into between the insulating patterns 230. The recess regions RR may expose top surfaces and bottom surfaces of the insulating patterns 230, portions of outer sidewalls of the cell charge storage structures 310, portions of outer sidewalls of the dummy charge storage structures 312, and portions of sidewalls of the cell semiconductor pillars CSP.

A gate insulating layer 340 may be formed on the sidewall of each of the cell semiconductor pillars CSP exposed by the recess region RR. The gate insulating layers 340 may be formed by performing an oxidation process on the sidewalls of the cell semiconductor pillars CSP. The gate insulating layer 340 may include, for example, a thermal oxide layer or a silicon oxide ($SiO_2$) layer. For example, the gate insulating layer 340 may be formed through thermal oxidation of the semiconductor material (e.g., silicon (Si)) of the cell semiconductor pillar CSP to form the thermal oxide layer (e.g., silicon oxide ($SiO_2$) layer) or through deposition of the silicon oxide ($SiO_2$) layer to cover the substrate 100.

A horizontal insulating layer 345 may be formed in the recess regions RR. For example, the horizontal insulating layer 345 may conformally cover surfaces of the insulating patterns 230, the exposed outer sidewalls of the cell charge storage structures 310, the exposed outer sidewalls of the dummy charge storage structures 312, exposed sidewalls of the gate insulating layers 340, and a sidewall of the first interlayer insulating layer 450. The horizontal insulating layer 345 may be formed using a deposition method having an excellent step coverage property. For example, the horizontal insulating layer 345 may be formed using a CVD process or an ALD process.

Gate electrodes 220a, 220b and 220c may be formed in the recess regions RR, respectively. In an exemplary embodiment of the present inventive concept, a metal layer may be formed in the common source trench CTH and the recess regions RR, and the metal layer formed in the common source trench CTH may be removed to form the gate electrodes 220a, 220b and 220c. The gate electrodes 220a, 220b and 220c may include, for example, doped silicon (Si), a metal (e.g., tungsten (W), copper (Cu), aluminum (Al), titanium (Ti) or tantalum (Ta)), a metal nitride (e.g., titanium nitride (TiN) or tantalum nitride (TaN)), a metal silicide (e.g., titanium silicide ($TiSi_2$), tungsten silicide ($WSi_2$), cobalt silicide ($CoSi_2$) or nickel silicide ($NiSi_2$)), or any combination thereof A common source region CSR may be formed in the substrate 100 exposed through the common source trench CTH, and may be formed using an ion implantation process. The common source region CSR may have a conductivity type different from that of the substrate 100.

A contact structure 440 may be formed in the common source trench CTH, and may include a spacer 441 and a common source contact 443. The spacer 441 may cover sidewalls of the common source trench CTH. The common source contact 443 may be formed to fill a remaining space of the common source trench CTH having the spacer 441.

Referring again to FIGS. 2 to 4, a second interlayer insulating layer 460 may be formed on the first interlayer insulating layer 450, and may cover a top surface of the contact structure 440. For example, the second interlayer insulating layer 460 may include a silicon oxide ($SiO_2$) layer. Cell contact plugs CCP may be formed on end portions of the gate electrodes 220a, 220b and 220c, which are disposed on the pad region PR of the substrate 100. The cell contact plugs CCP may include at least one of a metal material (e.g., copper (Cu) or tungsten (W)) and a metal nitride material (e.g., titanium nitride (TiN), tantalum nitride (TaN), or tungsten nitride (WN)).

Connection lines CW may be formed on the second interlayer insulating layer 460, and may be connected to the cell contact plugs CCP. A third interlayer insulating layer 480 may be formed on the second interlayer insulating layer 460, and may cover the connection lines CW. For example, the third interlayer insulating layer 480 may include a silicon oxide ($SiO_2$) layer.

Channel contact plugs HCP may be formed on the pads 330, may penetrate the first to third interlayer insulating layers 450, 460 and 480, and may be in direct contact with the pads 330. For example, the channel contact plugs HCP may include at least one of a metal material (e.g., copper (Cu) or tungsten (W)) and a metal nitride material (e.g., titanium nitride (TiN), tantalum nitride (TaN), or tungsten nitride (WN)). Bit lines BL may be formed on the third interlayer insulating layer 480. Each of the bit lines BL may be electrically connected to the cell vertical channel portions VC arranged in the second direction Y. For example, the bit lines BL may be connected to the pads 330 through the channel contact plugs HCP.

According to an exemplary embodiment of the present inventive concept, the dummy semiconductor pillar DSP may be formed on the substrate 100 which is in contact with the sidewall of the device isolation layer 20 formed in the substrate 100. Thus, the dummy semiconductor pillar DSP may be far away from the ground selection gate electrode 220a, thereby preventing a breakdown phenomenon through the dummy semiconductor pillar DSP.

According to an exemplary embodiment of the present inventive concept, in the etching process for exposing the cell semiconductor pillar CSP from the cell charge storage structure 310, the cell semiconductor pillar CSP in the channel hole CH may be exposed by the etching process but the dummy semiconductor pillar DSP in the dummy channel hole DCH1 or DCH2 may not be exposed. Thus, the dummy vertical channel portion DVC may be disconnected from the substrate 100. As a result, an additional process for isolating the dummy vertical channel portion DVC from the substrate 100 may not be required and a voltage applied to the substrate 100 may not affect the cell gate electrodes 220b, and thus electrical characteristics of the semiconductor memory device may be enhanced.

While the present inventive concept has been described with reference to the specific exemplary embodiments, it will be apparent to those skilled in the art that various changes and modifications may be made without departing from the spirits and scopes of the present inventive concept as defined by the appended claims. Therefore, it should be understood that the above exemplary embodiments are not limiting, but illustrative.

What is claimed is:

1. A semiconductor memory device comprising:
a substrate including a cell array region and a pad region;
a stack structure disposed on the cell array region and the pad region of the substrate and comprising gate electrodes;
a device isolation layer vertically overlapping the stack structure and disposed in the pad region of the substrate;
a first dummy vertical channel portion penetrating the stack structure on the pad region of the substrate and disposed in the device isolation layer; and
a first dummy semiconductor pillar disposed between the first dummy vertical channel portion and one portion of the substrate being in contact with one sidewall of the device isolation layer.

2. The semiconductor memory device of claim 1, wherein a bottom surface of the first dummy semiconductor pillar is disposed above a bottom surface of the device isolation layer.

3. The semiconductor memory device of claim 1, wherein a bottom surface of the first dummy semiconductor pillar is disposed at a level substantially the same as that of a bottom surface of the device isolation layer.

4. The semiconductor memory device of claim 1, further comprising:
a dummy charge storage structure disposed between the first dummy semiconductor pillar and the first dummy vertical channel portion and surrounding an outer sidewall of the first dummy vertical channel portion.

5. The semiconductor memory device of claim 4, wherein the first dummy vertical channel portion penetrates the dummy charge storage structure to contact the device isolation layer and is spaced apart from the first dummy semiconductor pillar.

6. The semiconductor memory device of claim 4, wherein the first dummy vertical channel portion penetrates the dummy charge storage structure to contact the first dummy semiconductor pillar and is spaced apart from the device isolation layer.

7. The semiconductor memory device of claim 4, wherein the first dummy vertical channel portion is spaced apart from the first dummy semiconductor pillar and the device isolation layer by the dummy charge storage structure.

8. The semiconductor memory device of claim 4, wherein the first dummy vertical channel portion penetrates the dummy charge storage structure to contact the device isolation layer and the first dummy semiconductor pillar.

9. The semiconductor memory device of claim 1, wherein the first dummy semiconductor pillar penetrates the one sidewall of the device isolation layer and is disposed in the substrate.

10. The semiconductor memory device of claim 1, wherein the stack structure extends in a first direction, and the semiconductor memory device further comprises:
a second dummy vertical channel portion spaced apart from the first dummy vertical channel portion in a second direction intersecting the first direction on the pad region of the substrate, the second dummy vertical channel portion penetrating the stack structure and disposed in the device isolation layer; and
a second dummy semiconductor pillar disposed between the second dummy vertical channel portion and another portion of the substrate being in contact with another sidewall of the device isolation layer opposite to the one sidewall, in the device isolation layer,
wherein a distance between a bottom end of the first dummy semiconductor pillar and a bottom end of the second dummy semiconductor pillar is equal to or greater than a width of a bottom surface of the device isolation layer in the second direction.

11. The semiconductor memory device of claim 1, wherein the stack structure extends in a first direction, and the semiconductor memory device further comprises:
a second dummy vertical channel portion spaced apart from the first dummy vertical channel portion in a second direction intersecting the first direction on the pad region of the substrate, the second dummy vertical channel portion penetrating the stack structure and disposed in the device isolation layer; and
a second dummy semiconductor pillar disposed between the second dummy vertical channel portion and another portion of the substrate being in contact with another sidewall of the device isolation layer opposite to the one sidewall, in the device isolation layer,
wherein a distance between a bottom end of the first dummy semiconductor pillar and a bottom end of the second dummy semiconductor pillar is smaller than a width of a bottom surface of the device isolation layer in the second direction.

12. The semiconductor memory device of claim 1, further comprising:
a peripheral circuit structure vertically overlapping the stack structure and comprising a peripheral circuit transistor.

13. The semiconductor memory device of claim 1, further comprising:
a cell vertical channel portion penetrating the stack structure on the cell array region of the substrate; and
a cell semiconductor pillar disposed between the cell vertical channel portion and the substrate,
wherein the cell vertical channel portion is in contact with the cell semiconductor pillar.

14. The semiconductor memory device of claim 13, wherein the gate electrodes include a first gate electrode, the cell semiconductor pillar penetrates the first gate electrode, and the semiconductor memory device further comprises:
a gate insulating layer disposed between the first gate electrode and the cell semiconductor pillar,
wherein a sidewall of the gate insulating layer has a curved surface.

15. The semiconductor memory device of claim 13, wherein
a vertical length of the first dummy vertical channel portion is greater than a vertical length of the cell vertical channel portion, and
a width of the first dummy vertical channel portion is greater than a width of the cell vertical channel portion.

16. A semiconductor memory device comprising:
a substrate including a cell array region and a pad region;
a stack structure disposed on the cell array region and the pad region of the substrate and comprising gate electrodes;
a device isolation layer vertically overlapping the stack structure and disposed in the pad region of the substrate;

a dummy vertical channel portion penetrating the stack structure on the pad region of the substrate and disposed in the device isolation layer; and a dummy semiconductor pillar disposed between the dummy vertical channel portion and the substrate in the device isolation layer, wherein the dummy vertical channel portion and the dummy semiconductor pillar are spaced apart from each other.

17. The semiconductor memory device of claim 16, further comprising:

a dummy charge storage structure disposed between the dummy semiconductor pillar and the dummy vertical channel portion and surrounding an outer sidewall of the dummy vertical channel portion.

18. The semiconductor memory device of claim 17, wherein the dummy vertical channel portion penetrates the dummy charge storage structure to contact the device isolation layer.

19. The semiconductor memory device of claim 16, wherein the dummy semiconductor pillar penetrates a portion of a sidewall of the device isolation layer.

20. The semiconductor memory device of claim 16, wherein a bottom surface of the dummy semiconductor pillar is disposed above a bottom surface of the device isolation layer.

21. The semiconductor memory device of claim 16, wherein a bottom surface of the dummy semiconductor pillar is inclined with respect to a top surface of the substrate.

22. The semiconductor memory device of claim 16, wherein a bottom surface of the dummy semiconductor pillar is substantially parallel to a top surface of the substrate.

23. A semiconductor memory device comprising:

a substrate including a cell array region and a pad region;

a stack structure disposed on the cell array region and the pad region of the substrate and comprising gate electrodes;

a device isolation layer vertically overlapping the stack structure and disposed in the pad region of the substrate;

a dummy vertical channel portion penetrating the stack structure on the pad region of the substrate and disposed in the device isolation layer; and a dummy semiconductor pillar disposed between the dummy vertical channel portion and the substrate in the device isolation layer, wherein a bottom surface of the dummy semiconductor pillar is disposed at a level substantially the same as or higher than that of a bottom surface of the device isolation layer.

24. The semiconductor memory device of claim 23, wherein the dummy semiconductor pillar is in contact with a portion of the substrate being in contact with a sidewall of the device isolation layer but is spaced apart from a portion of the substrate being in contact with the bottom surface of the device isolation layer.

25. The semiconductor memory device of claim 23, wherein the dummy semiconductor pillar is in contact with a portion of the substrate being in contact with a sidewall of the device isolation layer and is in contact with a portion of the substrate being in contact with the bottom surface of the device isolation layer.

* * * * *